(12) United States Patent
Xiong et al.

(10) Patent No.: US 11,411,162 B2
(45) Date of Patent: Aug. 9, 2022

(54) THIN-FILM PIEZOELECTRIC-MATERIAL ELEMENT, METHOD OF MANUFACTURING THE SAME, HEAD GIMBAL ASSEMBLY AND HARD DISK DRIVE

(71) Applicant: SAE Magnetics (H.K.) Ltd., Hong Kong (HK)

(72) Inventors: Wei Xiong, Hong Kong (HK); Atsushi Iijima, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 600 days.

(21) Appl. No.: 16/503,494

(22) Filed: Jul. 4, 2019

(65) Prior Publication Data

US 2020/0091400 A1     Mar. 19, 2020

Related U.S. Application Data

(63) Continuation-in-part of application No. 16/136,243, filed on Sep. 19, 2018, now Pat. No. 11,289,641.

(51) Int. Cl.
*H01L 41/047*    (2006.01)
*H01L 41/09*     (2006.01)
*H01L 41/18*     (2006.01)
*H01L 41/316*    (2013.01)
*G11B 5/48*      (2006.01)

(52) U.S. Cl.
CPC ...... *H01L 41/0471* (2013.01); *H01L 41/0474* (2013.01); *H01L 41/0475* (2013.01); *H01L 41/0913* (2013.01); *H01L 41/0986* (2013.01); *H01L 41/18* (2013.01); *H01L 41/316* (2013.01); *G11B 5/483* (2015.09)

(58) Field of Classification Search
CPC ............. H01L 41/0475; H01L 41/0471; H01L 41/0474; H01L 41/18
See application file for complete search history.

(56) References Cited

U.S. PATENT DOCUMENTS

| | | |
|---|---|---|
| 6,767,655 B2 | 7/2004 | Hiramoto et al. |
| 8,493,694 B2 | 7/2013 | Zheng et al. |
| 2003/0048041 A1* | 3/2003 | Kita ...................... H01L 41/332 310/328 |

(Continued)

*Primary Examiner* — Bryan P Gordon

(57) ABSTRACT

A thin-film piezoelectric-material element includes a laminated structure part having a lower electrode film, a piezoelectric-material film laminated on the lower electrode film and an upper electrode film laminated on the piezoelectric-material film, a lower piezoelectric-material protective-film being formed with alloy material, and an upper piezoelectric-material protective-film being formed with alloy material. The piezoelectric-material film includes a size larger than the upper electrode film, a riser end-surface and step-surface formed on a top-surface of the upper electrode film side. The riser end-surface connects smoothly with a peripheral end-surface of the upper electrode film and vertically intersects with the top-surface. The step-surface intersects vertically with the riser end-surface. The lower piezoelectric-material protective-film, and the upper piezoelectric-material protective-film are formed with alloy material including Fe as main ingredient and having Co and Mo, by Ion beam deposition.

1 Claim, 29 Drawing Sheets

(56) References Cited

U.S. PATENT DOCUMENTS

| | | | | |
|---|---|---|---|---|
| 2014/0035440 | A1* | 2/2014 | Aida | H01L 41/0805 |
| | | | | 310/365 |
| 2014/0240405 | A1* | 8/2014 | Furuya | B41J 2/1645 |
| | | | | 310/365 |
| 2014/0265726 | A1* | 9/2014 | Andosca | H02N 2/188 |
| | | | | 29/25.35 |
| 2015/0256144 | A1* | 9/2015 | Andosca | H01L 41/1134 |
| | | | | 216/13 |
| 2015/0280687 | A1* | 10/2015 | Burak | H03H 9/175 |
| | | | | 310/321 |
| 2017/0173634 | A1* | 6/2017 | Hashimoto | H01L 41/338 |
| 2017/0207383 | A1* | 7/2017 | Xiong | G11B 5/483 |
| 2017/0334205 | A1* | 11/2017 | Mizukami | B41J 2/1646 |

\* cited by examiner (a)

(b)

(a)

(b)

THIN-FILM PIEZOELECTRIC-MATERIAL ELEMENT, METHOD OF MANUFACTURING THE SAME, HEAD GIMBAL ASSEMBLY AND HARD DISK DRIVE

CROSS-REFERENCE TO RELATED APPLICATIONS

This application is a continuation-in-part application of application Ser. No. 16/136,243, filed Sep. 19, 2018, the entire contents of which is hereby incorporated herein by reference.

BACKGROUND

Field of the Invention

The present invention relates to a thin-film piezoelectric-material element which has a piezoelectric-material and electrodes having thin-film like shape, method of manufacturing the thin-film piezoelectric-material element, head gimbal assembly and hard disk drive having the thin-film piezoelectric-material element.

Related Background Art

A hard disk drive has a large recording capacity and is used as the heart of a storage device. The hard disk drive records and reproduces data to/from a hard disk (recording medium) by a thin-film magnetic head. A part, which the thin-film magnetic head is formed, is called as a head slider, and a part, which the head slider is mounted on the edge part, is a head gimbal assembly (will also be referred to as HGA).

Further, recording and reproducing of data to/from the recording medium is performed by flying the head slider from a surface of the recording medium while rotating the recording medium, in the hard disk drive.

On the other hand, it has become difficult to control a position of the thin-film magnetic head accurately by control with only a voice coil motor (VCM), because heightening a recording density of the recording medium has developed in company with increase of a capacity of the hard disk drive. Therefore formerly, a technology, which an actuator having supplementary function (a supplementary actuator) is mounted on the HGA in addition to a main actuator with the VCM, and the supplementary actuator controls a minute position that is not able to be controlled by the VCM, is known.

A technology, which the main actuator and the supplementary actuator control the position of the thin-film magnetic head, is also called two stage actuator system (dual-stage system).

In the two stage actuator system, the main actuator makes drive arms rotate to decide a position of the head slider on a specific track of the recording medium. Further, the supplementary actuator adjusts the position of the head slider minutely so that the position of the thin-film magnetic head may become an optimum position.

A micro actuator using a thin-film piezoelectric-material element is known formerly as the supplementary actuator. The thin-film piezoelectric-material element has a piezoelectric-material and a pair of electrodes formed to sandwich the piezoelectric-material, and each of them is formed to be a thin-film shape.

SUMMARY OF THE INVENTION

In case of the conventional thin-film piezoelectric-material element, the piezoelectric-material film, made of the piezoelectric-material, is sometimes formed by the size which is equal to the lower electrode film, and the upper electrode film is sometimes formed by the size which is equal to the piezoelectric-material film (see for example, U.S. Pat. No. 9,646,637 (also referred to as Patent document 1)).

On the other hand, concerning the conventional thin-film piezoelectric-material element, the side surface of the piezoelectric-material film is sometimes processed into a taper-shaped (see for example U.S. Pat. No. 5,410,208 (also referred to as Patent document 2), U.S. Pat. No. 8,342,660 (also referred to as Patent document 3), U.S. Pat. No. 6,351,057 (also referred to as Patent document 4), U.S. Pat. No. 9,375,923 (also referred to as Patent document 5) and so on). Further, the side surface of the piezoelectric-material film is sometimes processed into the step-shaped (see, for example U.S. Pat. No. 7,935,264 (also referred to as Patent document 6).

In these prior arts, the size of the piezoelectric-material film is larger than the size of the upper electrode film, the size of the lower electrode film is larger than the size of the piezoelectric-material film.

However, in these thin-film piezoelectric-material element, there is a following problem based on the size difference among the upper electrode film, the piezoelectric-material film and the lower electrode film.

Here, as illustrated in FIG. 27, the problem will be explained exemplary concerning the thin-film piezoelectric-material element 300, having the piezoelectric-material film 301, the upper electrode film 302, the lower electrode film 303, and which the piezoelectric-material film 301, the upper electrode film 302 and the lower electrode film 303 are formed equally about their film sizes.

Then, when voltage is applied to the piezoelectric-material element 300, as illustrated in FIG. 27, positive or negative charges emerge near the surface of the piezoelectric-material film 301 to cause deformation of the piezoelectric-material film 301.

However, as illustrated in FIG. 28, in case of the piezoelectric-material element 310, having the upper electrode film 304 smaller than the piezoelectric-material film 301, voltage is hardly applied to the outside-parts 301a, 301b, of the piezoelectric-material film 301 of the upper electrode film 304 side, situated outside of the upper electrode film 304. Then, charges, emerged in the outside-parts 301a, 301b, hardly follow change of the polarity of voltage, therefore, charges easily remain in the outside-parts 301a, 301b. When charges remain in the outside-parts 301a, 301b, the piezoelectric-material film 301 easily charges static electricity. Electric failure sometimes occurs around the thin-film piezoelectric-material element by that static electricity. Such a problem also occurs in the case, which the thin-film piezoelectric-material element 310 has the piezoelectric-material film 311, as illustrated in FIG. 29. Because the side surface of the piezoelectric-material film 311 is processed into the taper-shaped, and charges easily remain in the outside-part 311a, situated outside of the upper electrode film 304.

The present invention is made to solve the above problem, and it is an object to obtain the piezoelectric-material film having a structure which hardly charges static electricity and maintain a performance of the thin-film piezoelectric-material element as much as possible, even if there is a size difference among the upper electrode film, the piezoelectric-material film and the lower electrode film, in the thin-film piezoelectric-material element, method of manufacturing the thin-film piezoelectric-material element, head gimbal assembly and hard disk drive.

To solve the above problem, the present invention is a thin-film piezoelectric-material element including: a laminated structure part comprising a lower electrode film, a piezoelectric-material film laminated on the lower electrode film and an upper electrode film laminated on the piezoelectric-material film; a lower piezoelectric-material protective-film being formed with alloy material; and an upper piezoelectric-material protective-film being formed with alloy material, the piezoelectric-material film including: a film-size larger than the upper electrode film; and a riser end-surface and a step-surface, formed on a top-surface of the upper electrode film side, the riser end-surface connects smoothly with a peripheral end-surface of the upper electrode film and vertically intersects with the top-surface, the step-surface intersects vertically with the riser end-surface, the lower piezoelectric-material protective-film and the upper piezoelectric-material protective-film are formed to sandwich the laminated structure part, respectively in the lower side of the lower electrode film and the upper side of the upper electrode film, the lower piezoelectric-material protective-film and the upper piezoelectric-material protective-film are formed with alloy material including Fe as main ingredient and having Co and Mo, by Ion beam deposition.

Further, the present invention provides a thin-film piezoelectric-material element including: a laminated structure part comprising a lower electrode film, a piezoelectric-material film laminated on the lower electrode film and an upper electrode film laminated on the piezoelectric-material film; a lower piezoelectric-material protective-film being formed with alloy material; an upper piezoelectric-material protective-film being formed with alloy material, a surface layer insulating film, which are disposed on the side surfaces of the laminated structure part, the lower piezoelectric-material protective-film and the upper piezoelectric-material protective-film and on the top-surface of the upper piezoelectric-material protective-film, and which a through hole is formed; and a lower electrode pad being directly in contact with an exposed surface, of the lower electrode film, exposed inside the through hole, the piezoelectric-material film including: a film-size larger than the upper electrode film; and a riser end-surface and a step-surface, formed on a top-surface of the upper electrode film side, the riser end-surface connects smoothly with a peripheral end-surface of the upper electrode film and vertically intersects with the top-surface of the piezoelectric-material film, the step-surface intersects vertically with the riser end-surface, the lower piezoelectric-material protective-film and the upper piezoelectric-material protective-film are formed to sandwich the laminated structure part, respectively in the lower side of the lower electrode film and the upper side of the upper electrode film, the lower piezoelectric-material protective-film and the upper piezoelectric-material protective-film are formed with alloy material including Fe as main ingredient and having Co and Mo, by Physical Vapor Deposition.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of HGA)

Figure 1:
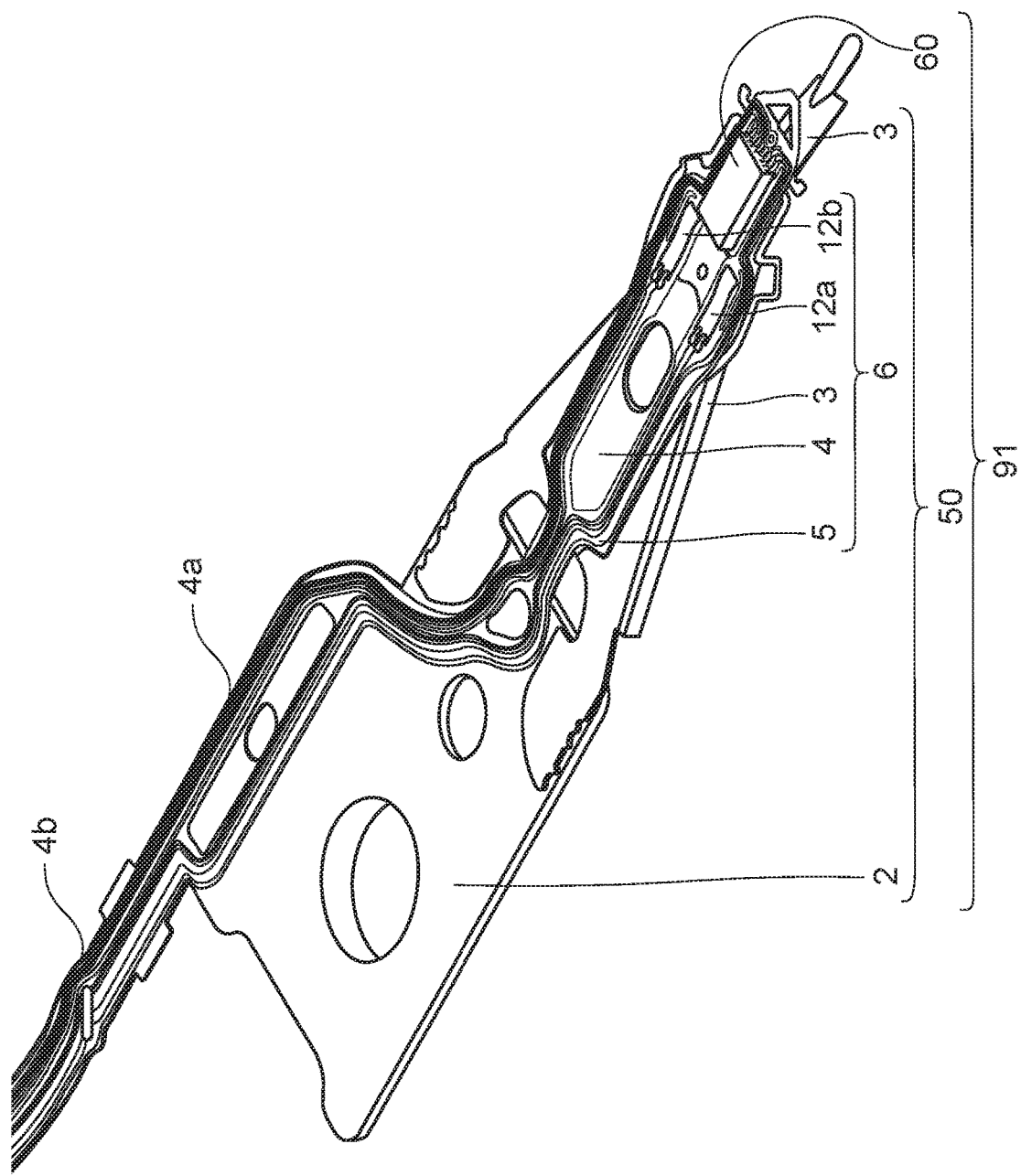
FIG. 1 is a perspective view showing a whole of the HGA, from front side, according to an embodiment of the present invention.
Figure 2:
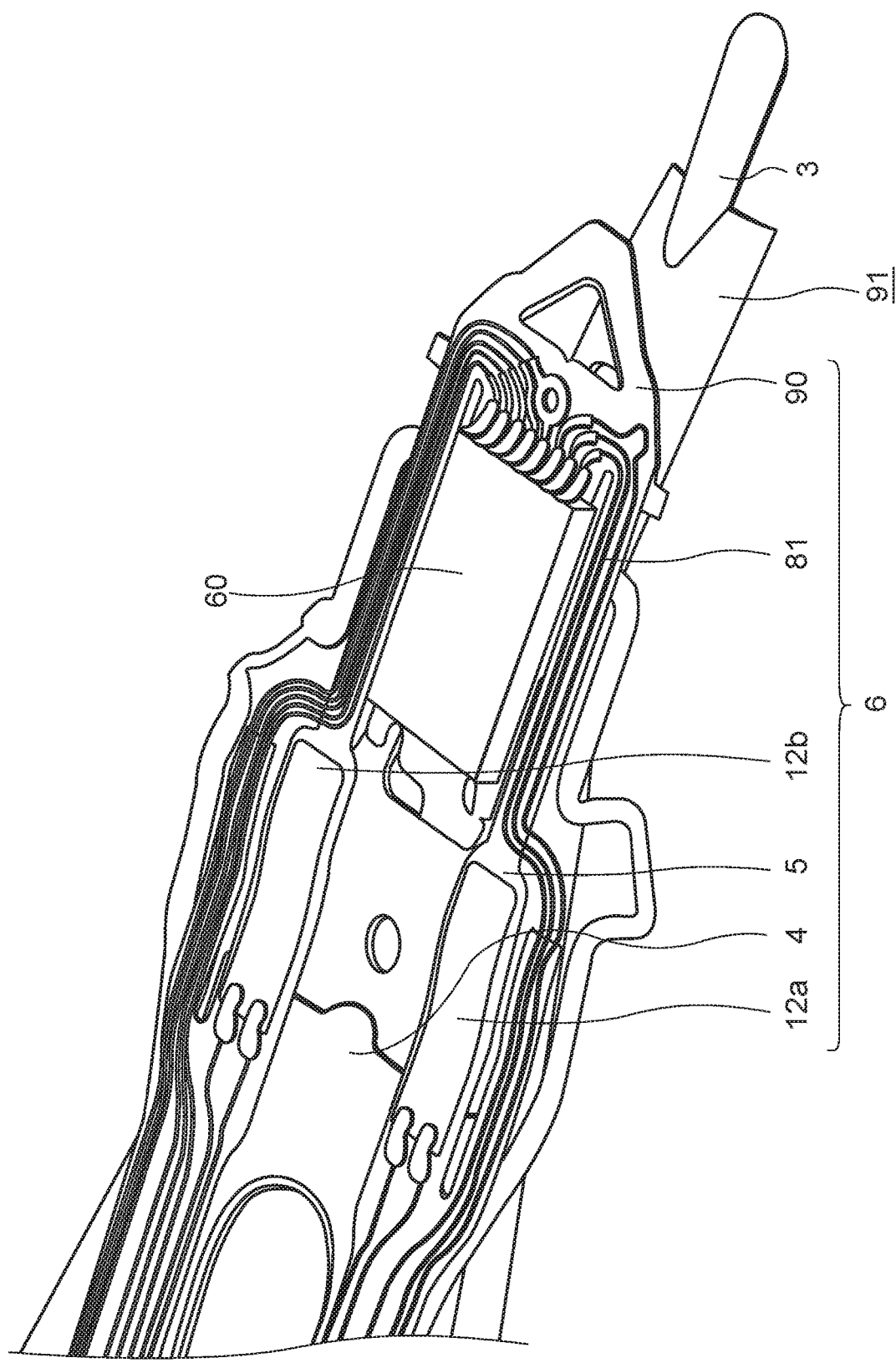
FIG. 2 is a perspective view showing a principal part of the HGA from front side.
Figure 3:
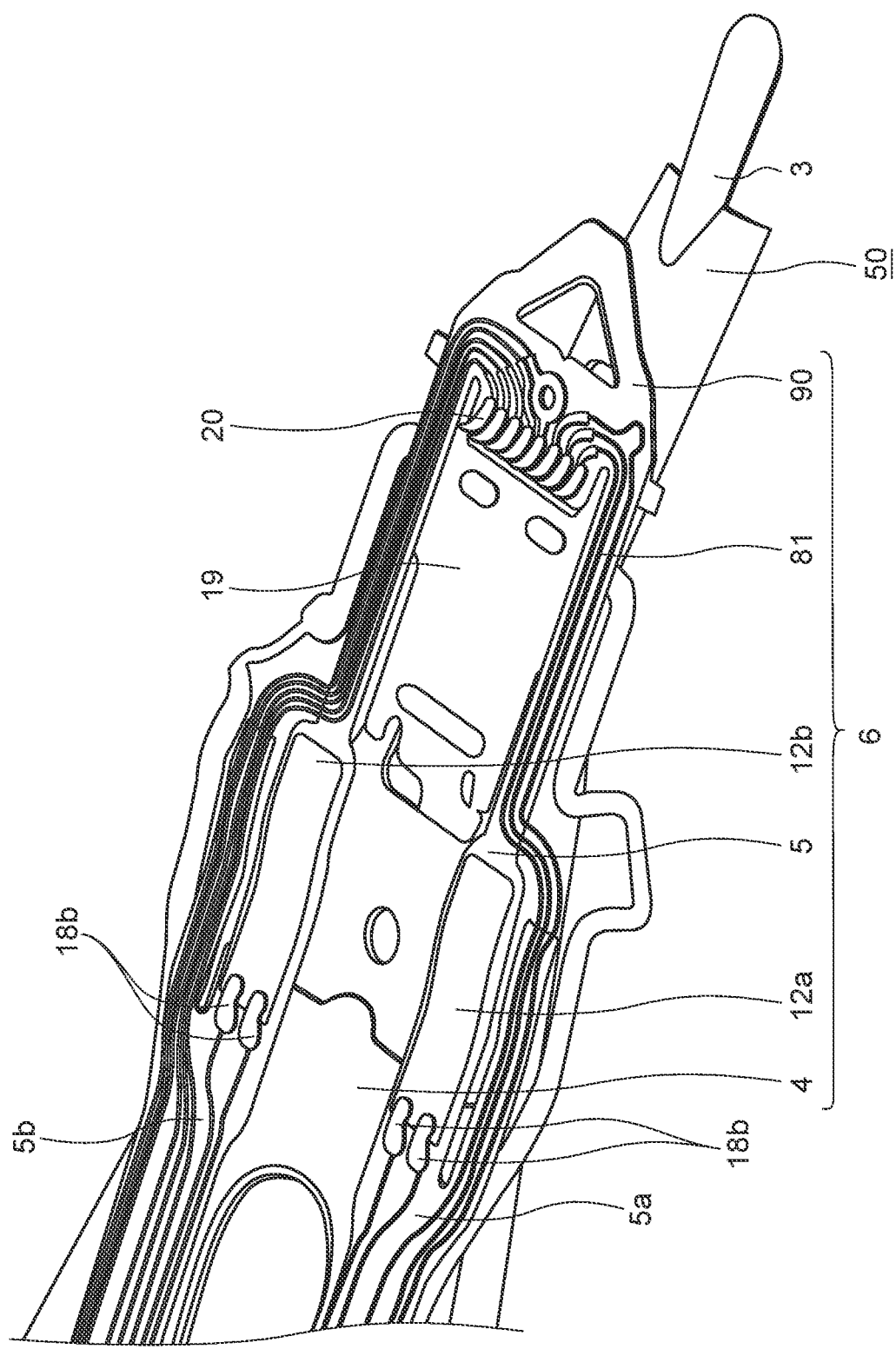
FIG. 3 is a perspective view showing a principal part of the suspension constituting the HGA in FIG. 1 from front side.

To begin with, a structure of the HGA according to the embodiment of the present invention will be explained with reference to FIG. 1 to FIG. 4. Here, FIG. 1 is a perspective view showing a whole of the HGA 91, from front side, according to an embodiment of the present invention. FIG. 2 is a perspective view showing a principal part of the HGA 91 from front side. FIG. 3 is a perspective view showing a principal part of the suspension 50 constituting the HGA 91 from front side.

Figure 4:
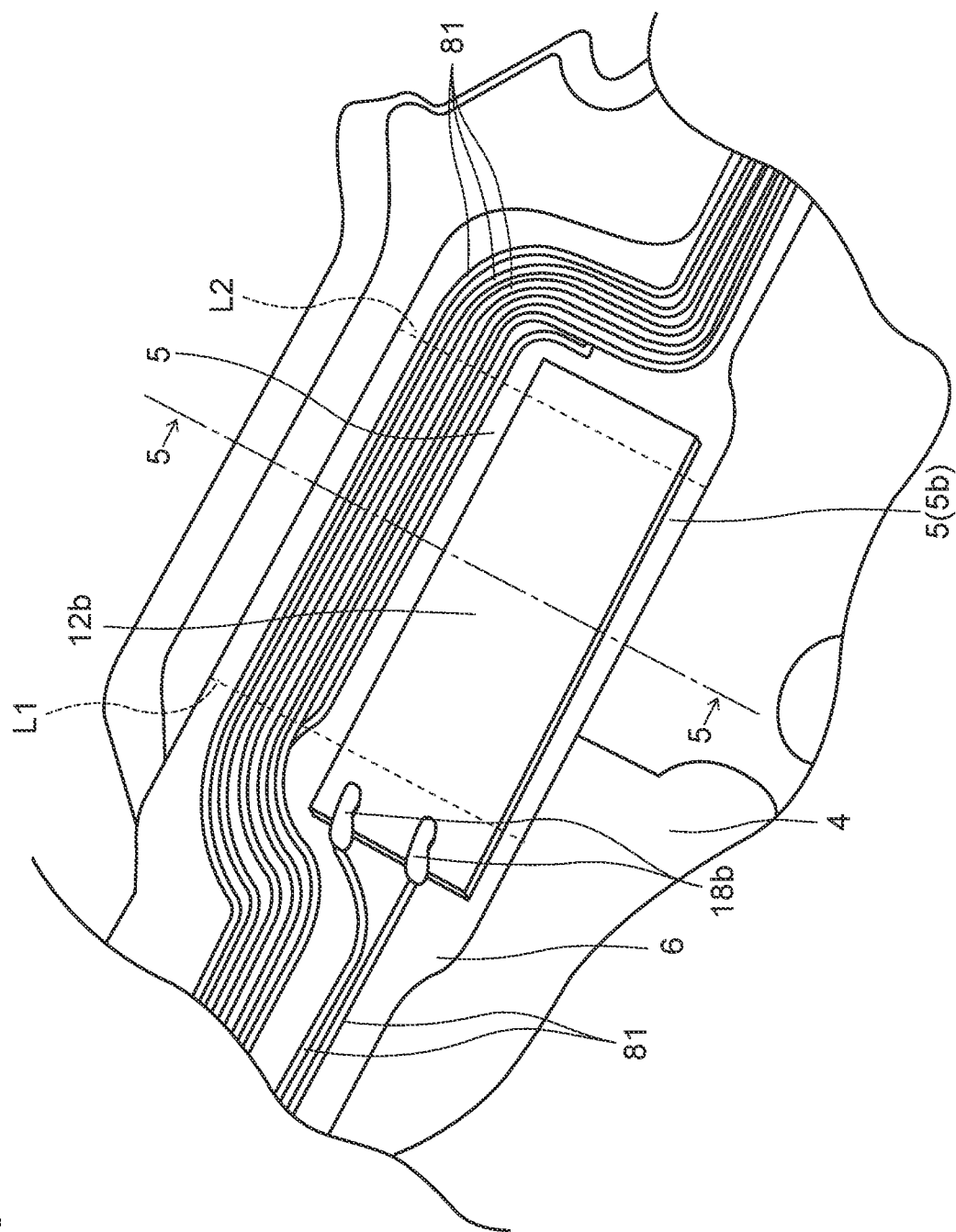
FIG. 4 is a perspective view showing a part, which a thin-film piezoelectric-material element is fixed, of a flexure with enlargement.

Further, FIG. 4 is a perspective view showing a part, which a thin-film piezoelectric-material element 12b is fixed, of a flexure 6 with enlargement.

As illustrated in FIG. 1, the HGA 91 has the suspension 50 and a head slider 60. The suspension 50 has a base plate 2, a load beam 3, the flexure 6 and a dumper not illustrated, and it has a structure which these parts are joined to be united one body by a weld and so on.

The base plate 2 is a part which is used to fix the suspension 50 to a drive arms 209 of a later-described hard disk drive 201, and it is formed with a metal such as stainless steel or the like.

The load beam 3 is fixed on the base plate 2. The load beam 3 has a shape in which the width gradually decreases as it is distanced more from the base plate 2. The load beam 3 has a load bending part which generates a power for pressing the head slider 60 against the later-described hard disk 202 of the hard disk drive 201.

Further, as illustrated in FIG. 1 to FIG. 4, the flexure 6 has a flexure substrate 4, a base insulating layer 5, a connecting wiring 81 and thin-film piezoelectric-material elements 12a, 12b. The flexure 6 has a structure which the base insulating layer 5 is formed on the flexure substrate 4, the connecting wiring 81 and thin-film piezoelectric-material elements 12a, 12b are adhered on the base insulating layer 5. Further, the not illustrated protective insulating layer is formed so as to cover the connecting wiring 81 and thin-film piezoelectric-material elements 12a, 12b.

The flexure 6 has piezoelectric-material elements attached structure which thin-film piezoelectric-material elements 12a, 12b are fixed on the surface of the base insulating layer 5 in addition to the connecting wiring 81 to become a structure with piezoelectric-material element.

Further, the flexure 6 has a gimbal part 90 on the tip side (load beam 3 side). A tongue part 19, which the head slider 60 is mounted, is secured on the gimbal part 90, and a plurality of connecting pads 20 are formed near an edge side than the tongue part 19. Connecting pads 20 are electrically connected to not-illustrated electrode pads of the head slider 60.

This flexure 6 expands or shrinks thin-film piezoelectric-material elements 12a, 12b and expands or shrinks stainless part (referred to out trigger part) jut out outside of the tongue part 19. That makes a position of the head slider 60 move very slightly around not-illustrated dimple, and a position of the head slider 60 is controlled minutely.

The flexure substrate 4 is a substrate for supporting a whole of the flexure 6, and it is formed with stainless. Rear side of the flexure substrate 4 is fixed to the base plate 2 and the load beam 3 by weld. As illustrated in FIG. 1, the flexure substrate 4 has a center part 4a fixed to surfaces of the load beam 3 and the base plate 2, and a wiring part 4b extending to outside from the base plate 2.

The base insulating layer 5 covers s surface of the flexure substrate 4. The base insulating layer 5 is formed with for example polyimide, and it has a thickness of about 5 μm to 10 μm. Further, as illustrated in detail in FIG. 3, a part of the base insulating layer 5, disposed on the load beam 3, is divided two parts. One part of them is a first wiring part 5a, the other part of them is second wiring part 5b. The thin-film piezoelectric-material element 12a and thin-film piezoelectric-material element 12b are adhered on surfaces of each wiring part.

A plurality of connecting wirings 81 are formed on surfaces of each of the first wiring part 5a and the second wiring part 5b. Each connecting wiring 81 is formed with conductor such as copper or the like. One end parts of each connecting wiring 81 are connected to the thin-film piezoelectric-material elements 12a, 12b or each connecting pad 20.

The not-illustrated protective insulating layer is formed with for example polyimide. The protective insulating layer has a thickness of about 1 μm to 2 μm, for example.

Further, a not illustrated thin-film magnetic head, which records and reproduces data, is formed on the head slider 60. Furthermore, a plurality of not illustrated electrode pads are formed on the head slider 60, and each electrode pad is connected to the connecting pad 20.

(Structure of Thin-Film Piezoelectric-Material Element)

Figure 5:
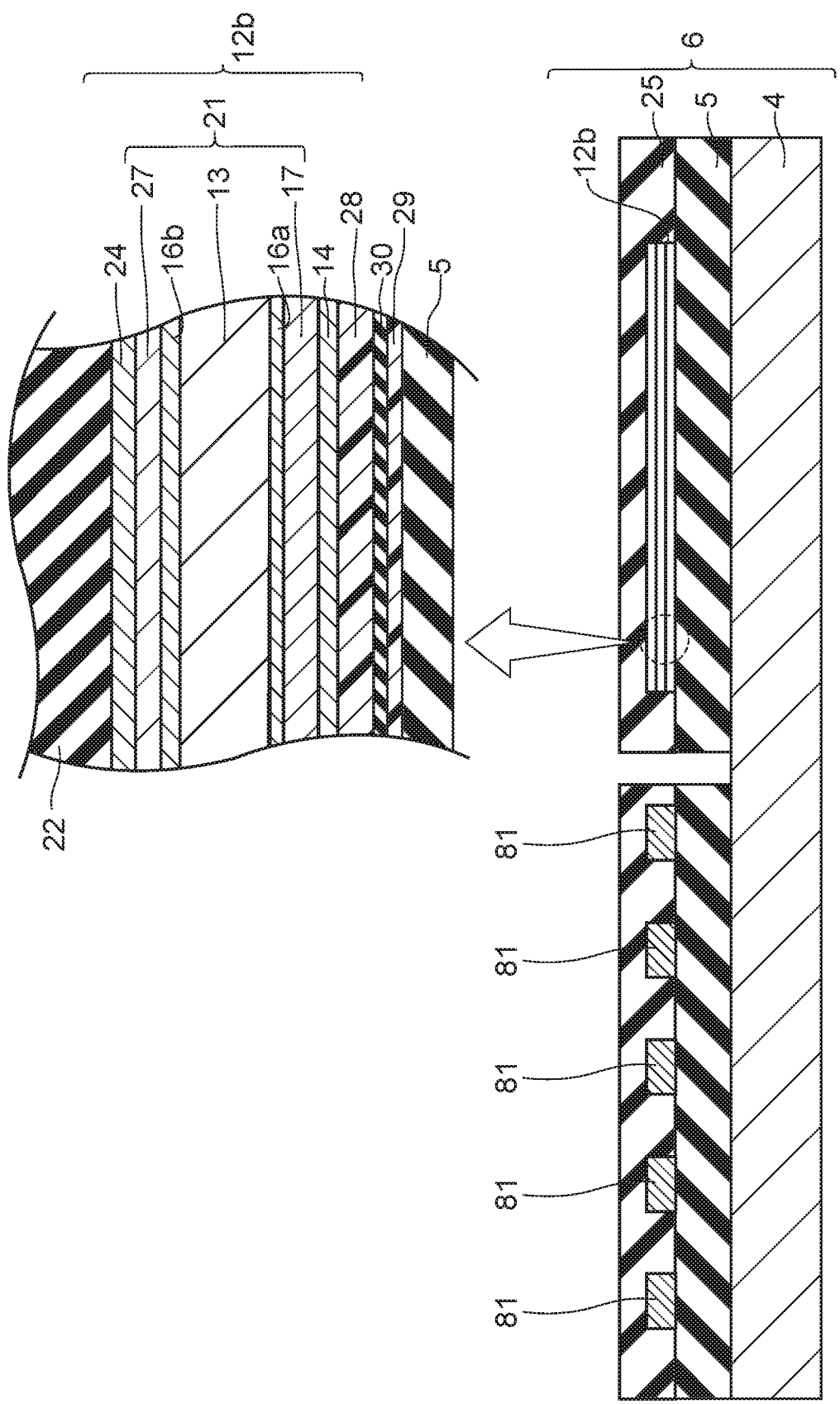
FIG. 5 is a sectional view taken along the line 5-5 in FIG. 4.
Figure 6:
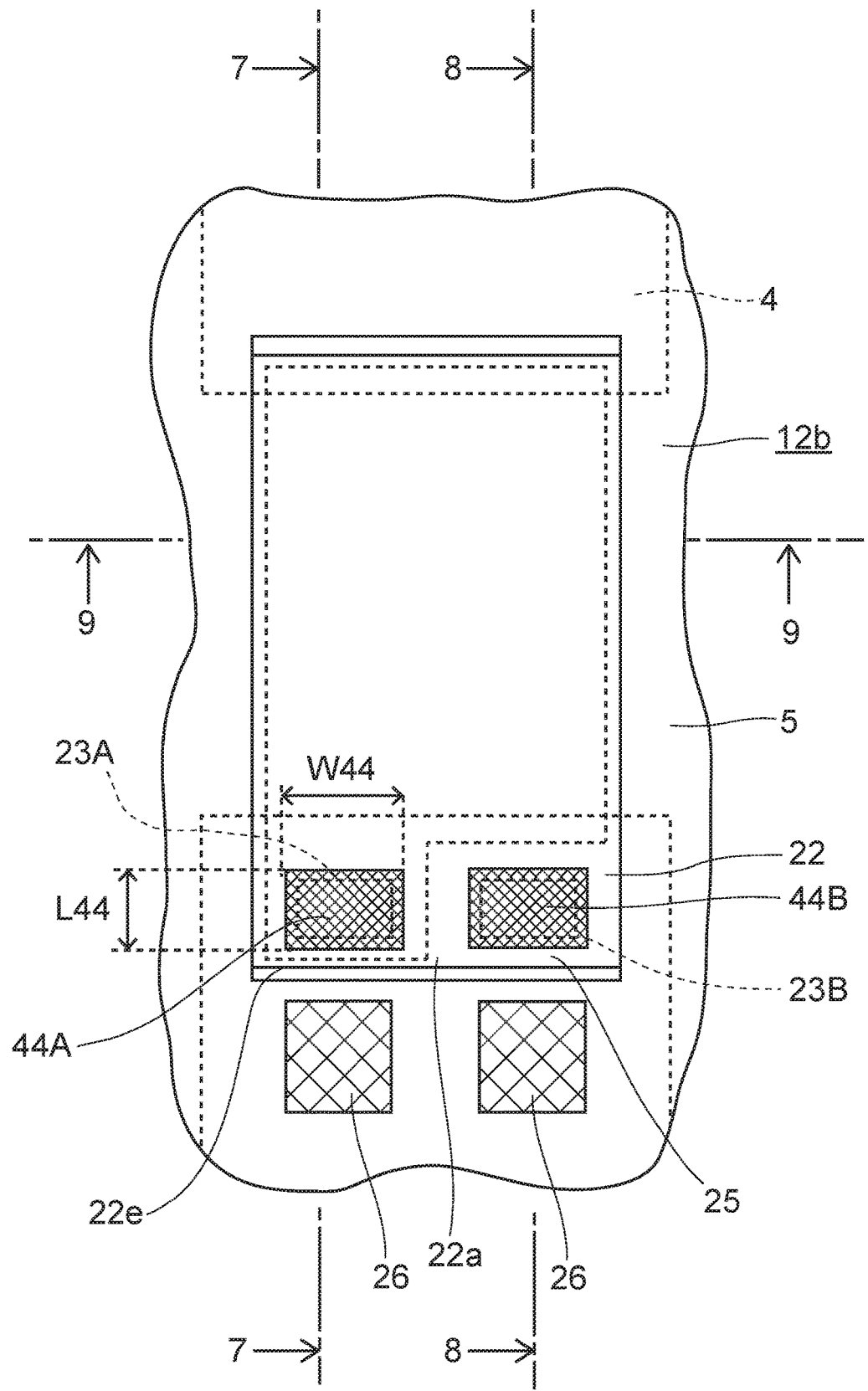
FIG. 6 is a plan view showing the thin-film piezoelectric-material element and the peripheral part of the HGA.
Figure 7:
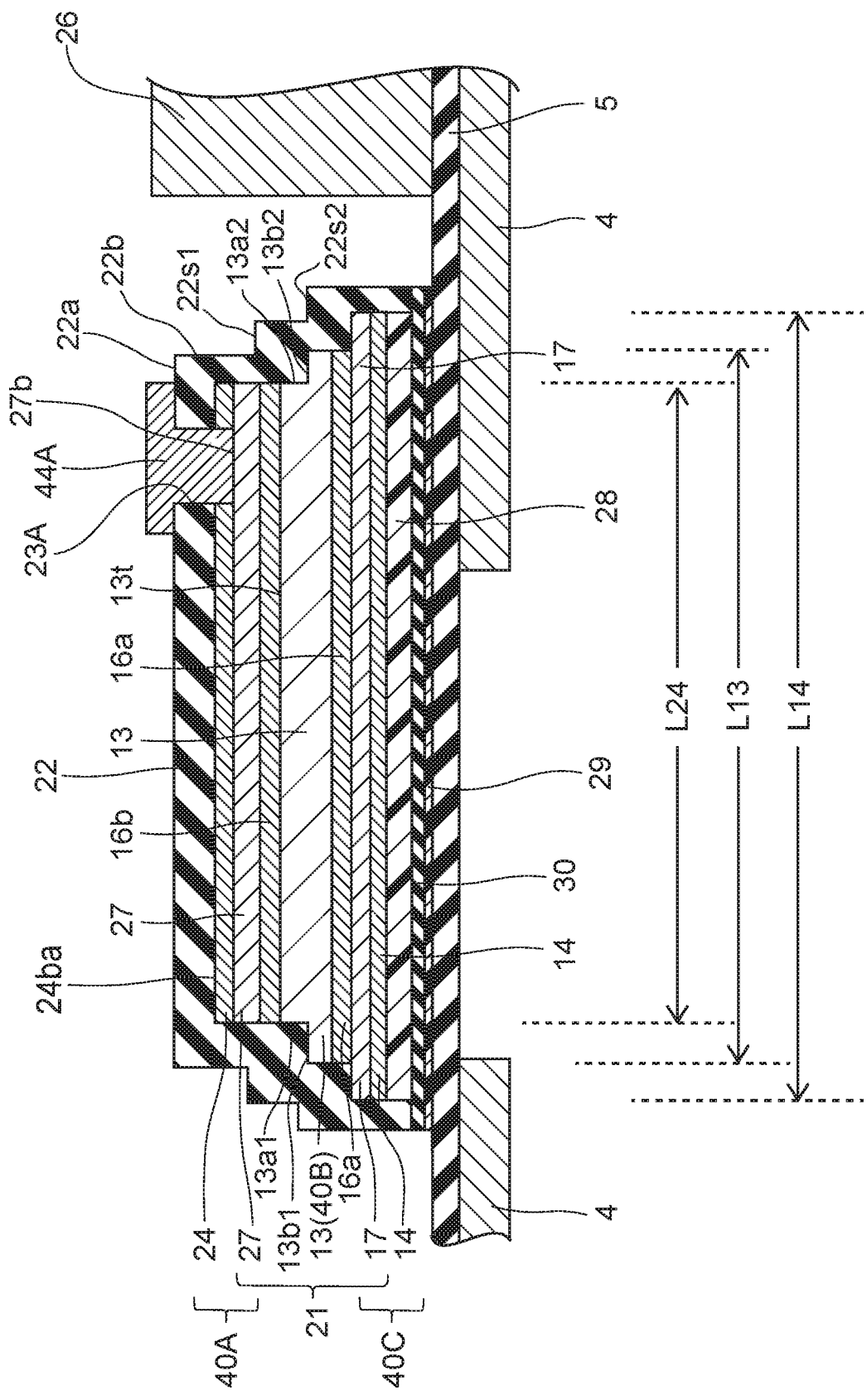
FIG. 7 is a sectional view taken along the line 7-7 in FIG. 6.
Figure 8:
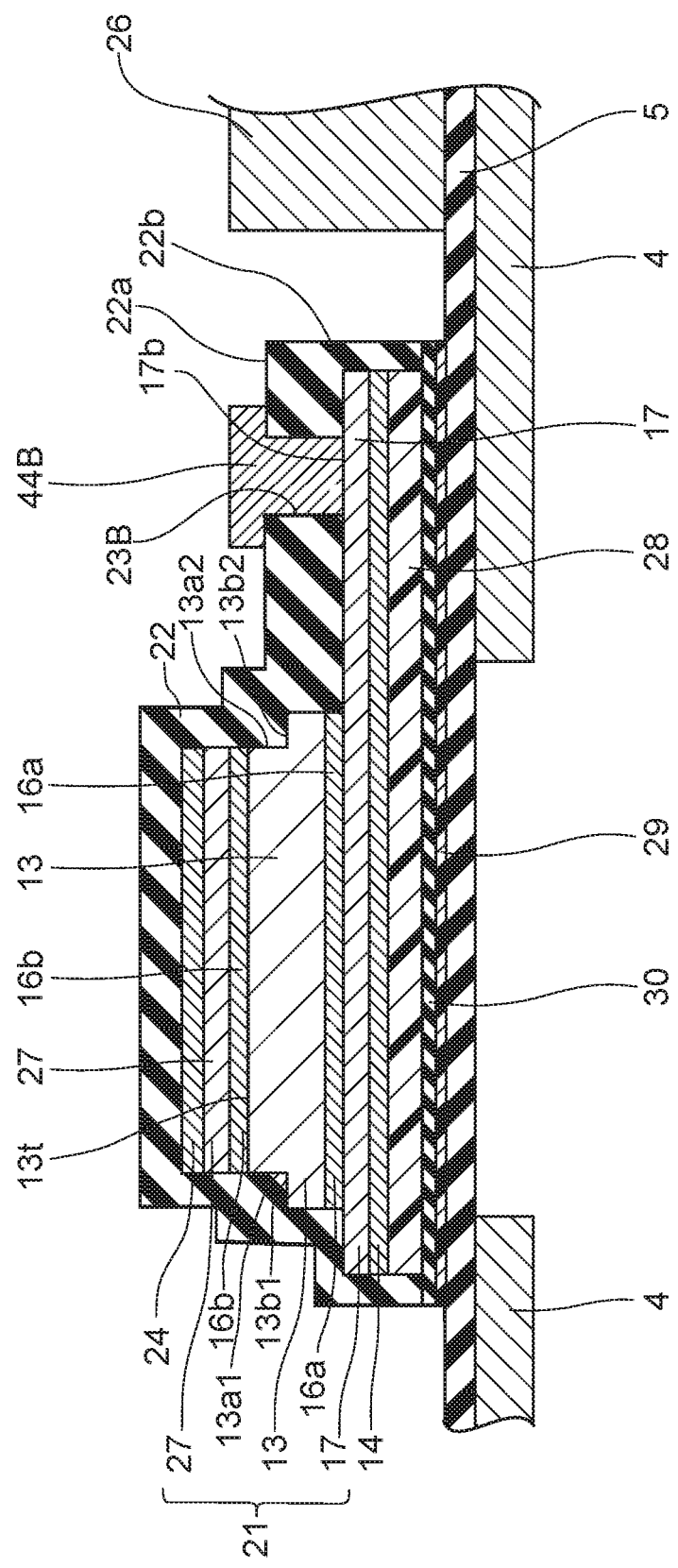
FIG. 8 is a sectional view taken along the line 8-8 in FIG. 6.
Figure 9:
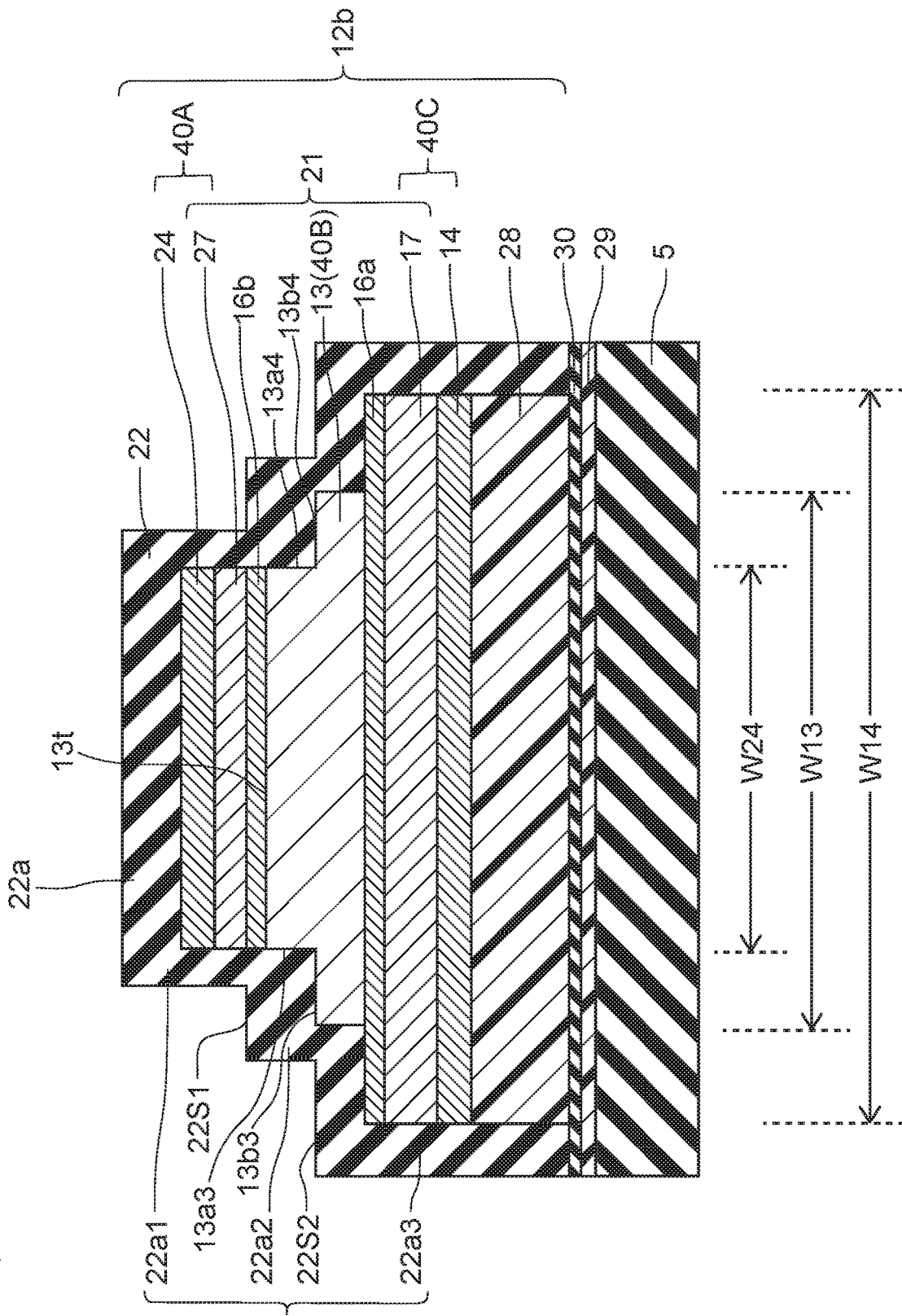
FIG. 9 is a sectional view taken along the line 9-9 in FIG. 6.

Subsequently, the structure of thin-film piezoelectric-material element 12b will be explained with reference to FIG. 5 to FIG. 9. Here, FIG. 5 is a sectional view taken along the line 5-5 in FIG. 4, FIG. 6 is a plan view showing the thin-film piezoelectric-material element 12b and the peripheral part of the HGA 91. FIG. 7 is a sectional view taken along the line 7-7 in FIG. 6, FIG. 8 is a sectional view taken along the line 8-8 in FIG. 6. FIG. 9 is a sectional view taken along the line 9-9 in FIG. 6. Note that the connecting electrode 18b is omitted in FIGS. 6-8 for convenience of illustration.

The thin-film piezoelectric-material element 12b (similar to thin-film piezoelectric-material element 12a), as illustrated in FIG. 5-FIG. 9, has a laminated structure part 21, a lower piezoelectric-material protective-film 14, an upper piezoelectric-material protective-film 24, a surface layer insulating film 22, an upper electrode pad 44A, a lower electrode pad 44B and an adhesive resin layer 28. In the thin-film piezoelectric-material element 12b, the lower piezoelectric-material protective-film 14 and the upper piezoelectric-material protective-film 24 are formed to sandwich the laminated structure part 21.

The thin-film piezoelectric-material elements 12b, 12a are adhered to the surface of the base insulating layer 5 with epoxy resin. A resin layer 29, made of the epoxy resin, and a support layer 30 (for example $SiO_2$) are formed between the thin-film piezoelectric-material element 12b and the base insulating layer 5.

The thin-film piezoelectric-material element 12b is formed with a rectangular shape in a plan view, as illustrated in FIG. 6. A pad region 25 is secured at one side along with a long-side direction of the thin-film piezoelectric-material element 12b. The pad region 25 is a region from a boundary line 22e, of a top disposed part 22a and a side disposed part 22b of the later-described surface layer insulating film 22, to the upper electrode pad 44A and the lower electrode pad 44B. An upper through hole 23A, a lower through hole 23B, the upper electrode pad 44A and the lower electrode pad 44B are formed in the pad region 25.

Note that "upper" and "lower" in the present invention do not show necessarily upper side, lower side in a condition which the thin-film piezoelectric-material element is adhered on the base insulating layer 5. These words are terms for reasons of convenience so as to distinguish two upper, lower electrode films 21b, 21c and so on opposing each other sandwiching the piezoelectric-material film 13 between them. In the actual products, the upper electrode film 27 is sometimes disposed lower side, and the lower electrode film 17 is sometimes disposed upper side.

The laminated structure part 21 has a piezoelectric-material film 13, a lower electrode film 17 and an upper electrode film 27. The piezoelectric-material film 13 is laminated on the lower electrode film 17, the upper electrode film 27 is laminated on the piezoelectric-material film 13. The laminated structure part 21 has a laminated structure formed of the piezoelectric-material film 13, the lower electrode film 17 and the upper electrode film 27. Besides, the laminated structure part 21 further has a lower diffusion-barrier-film 16a, laminated between the lower electrode film 17 and the piezoelectric-material film 13, and an upper diffusion-barrier-film 16b, laminated between the upper electrode film 27 and the piezoelectric-material film 13.

The piezoelectric-material film 13 is formed to be a thin-film shape using a piezoelectric-material made of lead zirconate titanate, shown by general formula Pb $(Zr_xTi_{(1-x)})$ $O_3$ (referred to also as "PZT" in the following). The piezoelectric-material film 13 is an epitaxial film formed by epitaxial growth, and for example it has a thickness of about 1 μm-5 μm. Further, the piezoelectric-material film 13 is sputter film formed by sputtering.

The piezoelectric-material film 13 will be explained in detail with reference to FIG. 22, FIG. 25 in addition to FIG. 7 to FIG. 9. The piezoelectric-material film 13 has a film-size (size of a plane direction) larger than the upper electrode film 27. However, riser end-surfaces 13a1-13a4, step-surfaces 13b1-13b4 are formed on a top-surface 13t of the upper electrode film 27 side, the peripheral part of the top-surface 13t connect smoothly with a peripheral end-surface 27t of the upper electrode film 27.

Figure 22:
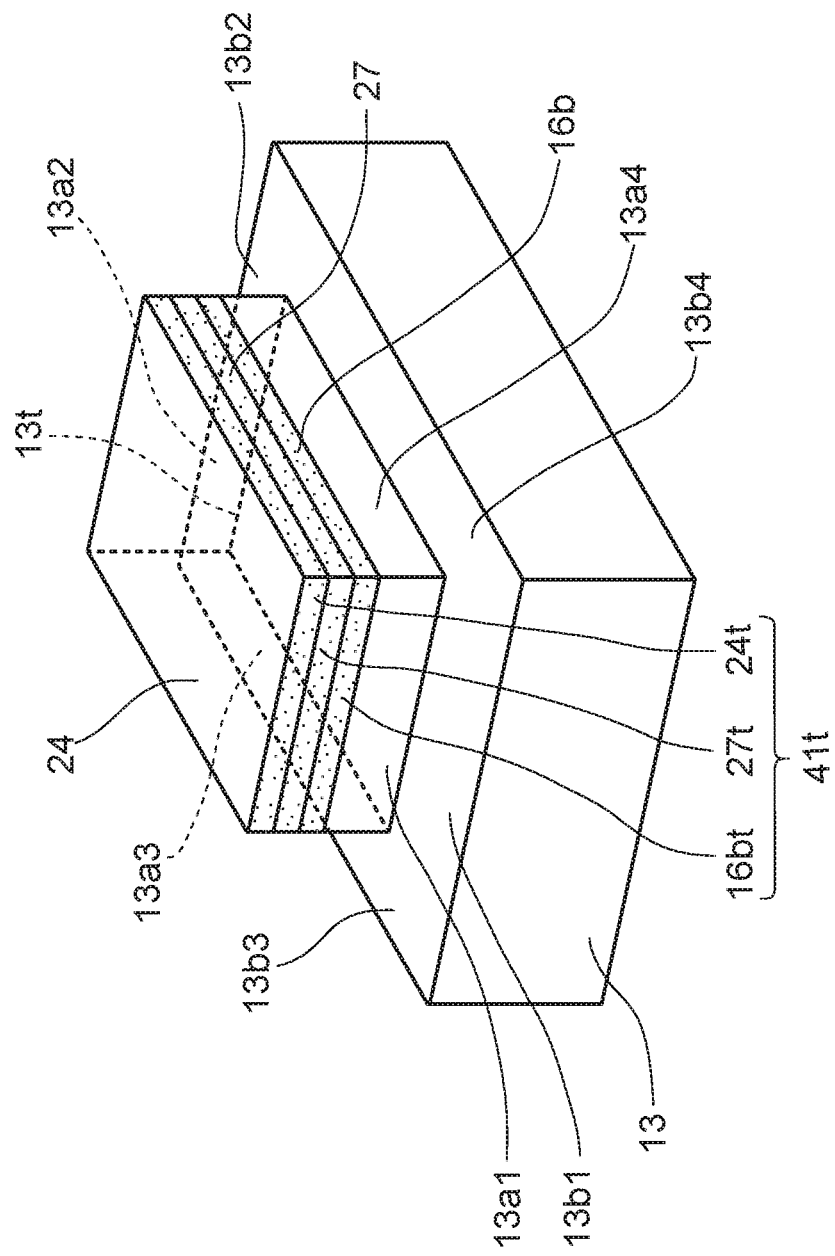
FIG. 22 is a perspective view showing the piezoelectric-material film, an upper diffusion-barrier-film, the upper electrode film, an upper piezoelectric-material protective-film according to the embodiment of the present invention.

Then, the riser end-surfaces 13a1, 13a2, 13a3, 13a4 of the piezoelectric-material film 13 connect smoothly with a sequential peripheral end-surface 41t, illustrated in FIG. 22, and they vertically intersect with the top-surface 13t. The riser end-surfaces 13a1, 13a2, 13a3, 13a4 form a flat surface together with the sequential peripheral end-surface 41t.

The sequential peripheral end-surfaces 41t is a flat surface including a peripheral end-surface 16bt of the upper diffusion-barrier-film 16b, the peripheral end-surface 27t of the upper electrode film 27 and a peripheral end-surface 24t of the upper piezoelectric-material protective-film 24, and they are arranged in the four directions of the upper diffusion-barrier-film 16b, the upper electrode film 27 and the upper piezoelectric-material protective-film 24. The parts with dot in FIG. 22 show the sequential peripheral end-surfaces 41t. The riser end-surfaces 13a1, 13a2, 13a3, 13a4 connect smoothly with not only the peripheral end-surface 27t of the upper electrode film 27 but also the peripheral end-surface 24t of the upper piezoelectric-material protective-film 24.

The step-surfaces 13b1, 13b2, 13b3, 13b4 intersect vertically with the respective riser end-surfaces 13a1, 13a2, 13a3, 13a4.

Then, the step-surface 13b1, riser end-surface 13a1 oppose to the step-surface 13b2, riser end-surface 13a2. Besides, the step-surface 13b3, riser end-surface 13a3 oppose to the step-surface 13b4, riser end-surface 13a4. Further, the step-surface 13b1, riser end-surface 13a1 and the step-surface 13b2, riser end-surface 13a2 are arranged respectively the both-sides of the long-side direction, of the thin-film piezoelectric-material element 12b (piezoelectric-material film 13). Further, the step-surface 13b3, riser end-surface 13a3 and the step-surface 13b4, riser end-surface 13a4 are arranged respectively the both-sides of the short-side direction, of the thin-film piezoelectric-material element 12b (piezoelectric-material film 13). Accordingly, in the piezoelectric-material film 13, the riser end-surface and step-surface are formed in the both-sides of the long-side direction and the both-sides of the short-side direction, of the piezoelectric-material film 13.

A piezoelectric ceramics (much of them are ferroelectric substance) such as barium titanate, lead titanate or the like, non-lead system piezoelectric ceramics not including titanium or lead are able to be used for the piezoelectric-material film 13 instead of using PZT.

The lower electrode film 17 is a thin-film (thickness about 100 nm) made of metal element which has Pt (it may include Au, Ag, Pd, Ir, Ru, Cu, in addition to Pt) as main ingredient, it is formed on the lower piezoelectric-material protective-film 14. A crystal structure of the lower electrode film 17 is a face-centered cubic structure.

The upper electrode film 27 is a polycrystal thin-film (thickness about 50 nm) with metal element which has Pt (it may include Au, Ag, Pd, Ir, Rh, Ni, Pb, Ru, Cu, in addition to Pt) as main ingredient, it is formed on the upper diffusion-barrier-film 16b. The upper electrode film 27 has a figure which the part under the lower through hole 23B and the peripheral part are lacked (hereinafter, referred also to as "partial lacked figure"), so as not to be in touch with later-described lower electrode pad 44B.

The lower diffusion-barrier-film 16a is a thin-film (thickness about 20 nm) made of conductive material, including strontium and ruthenium, such as $SrRuO_3$ (also referred SRO) or the like formed by epitaxial growth. The lower diffusion-barrier-film 16a is formed by sputtering. The lower diffusion-barrier-film 16a is formed on the upper surface of the lower electrode film 17 of the piezoelectric-material film 13 side. The piezoelectric-material film 13 is formed on the lower diffusion-barrier-film 16a.

The upper diffusion-barrier-film 16b is a thin-film (thickness about 10 nm-35 nm) made of amorphous conductive material, including strontium and ruthenium, such as $SrRuO_3$ (also referred SRO) or the like, and it is formed on the upper surface of the upper electrode film 27 of the piezoelectric-material film 13 side. The upper diffusion-barrier-film 16b is also formed by sputtering.

The lower piezoelectric-material protective-film 14, upper piezoelectric-material protective-film 24 are respectively formed on the lower side of the lower electrode film 17, on the upper side of the upper electrode film 27. The lower piezoelectric-material protective-film 14, upper piezoelectric-material protective-film 24 are polycrystal thin-films (thickness about 100 nm) using alloy material.

The lower piezoelectric-material protective-film 14, the upper piezoelectric-material protective-film 24 are formed with alloy material which has iron (Fe) as main ingredient, for example. It is preferable that crystal structures of the lower piezoelectric-material protective-film 14, the upper piezoelectric-material protective-film 24 are body-centered cubic structure. It is preferable that the lower piezoelectric-material protective-film 14, the upper piezoelectric-material protective-film 24 are formed with alloy material which include Fe and at least any one of Co, Mo, Au, Pt, Al, Cu, Ag, Ta, Cr, Ti, Ni, Ir, Nb, Rb, Cs, Ba, V, W, Ru. Further, it is more preferable that the lower piezoelectric-material protective-film 14, the upper piezoelectric-material protective-film 24 are formed with alloy material which includes Fe and Co, Mo. The lower piezoelectric-material protective-film 14, the upper piezoelectric-material protective-film 24 are able to be formed by PVD (Physical Vapor Deposition) such as IBD (Ion Beam Deposition), sputtering, Vacuum Evaporation, MBE (Molecular Beam Epitaxy), Ion Plating or the like.

Then, the thin-film piezoelectric-material element 12b has a film-size extended structure. The film-size extended structure means a structure which sizes of a later-described upper film part 40A, middle film part 40B and lower film part 40C are extended in that order. Namely, in the thin-film piezoelectric-material element 12b, the size of the middle film part 40B is larger than the size of the upper film part 40A, the size of the lower film part 40C is larger than the size of the middle film part 40B. In this embodiment, the upper film part 40A means a part including the upper electrode film 27 and the upper piezoelectric-material protective-film 24, the middle film part 40B means a part including the piezoelectric-material film 13, and the lower film part 40C means a part including the lower electrode film 17 and lower piezoelectric-material protective-film 14.

Further, in the thin-film piezoelectric-material element 12b, long-side widths and short-side widths, about all of the lower piezoelectric-material protective-film 14, lower electrode film 17, piezoelectric-material film 13, upper piezoelectric-material protective-film 24 and upper electrode film 27, are extended in the order of the upper film part 40A, middle film part 40B and lower film part 40C. In this case, the long-side width means a width along with long-side direction of the thin-film piezoelectric-material element 12b, short-side width means a width along with short-side direction of the thin-film piezoelectric-material element 12b.

Namely, in the thin-film piezoelectric-material element 12b, as illustrated in FIG. 7, when the long-side width of the upper piezoelectric-material protective-film 24 and upper electrode film 27 is L24, the long-side width of the piezoelectric-material film 13 is L13, and long-side width of the lower piezoelectric-material protective-film 14 and lower electrode film 17 is L14, L24<L13<L14.

Further, as illustrated in FIG. 9, when the short-side width of the upper piezoelectric-material protective-film 24 and upper electrode film 27 is W24, the short-side width of the piezoelectric-material film 13 is W13, and short-side width of the lower piezoelectric-material protective-film 14 and lower electrode film 17 is W14, W24<W13<W14.

The surface layer insulating film 22 is disposed on the top-surface and side surfaces of four directions of the laminated structure part 21, and it is formed so as to cover the top-surface and side surfaces of four directions of the laminated structure part 21. The surface layer insulating film 22 is formed with insulating material such as polyimide or the like. The surface layer insulating film 22 has a top disposed part 22a and a side disposed part 22b.

The top disposed part 22a is a part disposed on the top-surface of the laminated structure part 21. The top disposed part 22a is formed directly on the top-surface 24ba of the upper piezoelectric-material protective-film 24. One end side of the long-side direction of the top disposed part 22a is assigned to the pad region 25. The upper through hole 23A and lower through hole 23B are formed on the top disposed part 22a.

The upper through hole 23A is formed in the pad region 25 of the top disposed part 22a. The upper through hole 23A penetrates the top disposed part 22a of the surface layer insulating film 22 and the upper piezoelectric-material protective-film 24, as illustrated in FIG. 7. The top-surface of the upper electrode film 27 is exposed, inside the upper through hole 23A, as an exposed surface 27b. Further, because the upper piezoelectric-material protective-film 24 is formed with alloy material, a not-illustrated insulating film is formed on a part, through the upper piezoelectric-material protective-film 24, inside the upper through hole 23A.

The lower through hole 23B is also formed in the pad region 25 of the top disposed part 22a. The lower through hole 23B penetrates the top disposed part 22a, similar with the upper through hole 23A, as illustrated in FIG. 8. Because the upper electrode film 27 and the upper piezoelectric-material protective-film 24 are formed with the above-described partial lacked figure, the top-surface of the lower electrode film 17 is exposed, inside the lower through hole 23B, as an exposed surface 17b.

Then, the upper electrode pad 44A, lower electrode pad 44B are respectively formed in the upper through hole 23A, lower through hole 23B. The upper electrode pad 44A is formed in a rectangular parallelepiped shape. The upper electrode pad 44A is in directly contact with the exposed surface 27b of the upper electrode film 27. The lower electrode pad 44B is formed in a rectangular parallelepiped shape. The lower electrode pad 44B is in directly contact with the exposed surface 17b of the lower electrode film 17. The long-side width of the upper electrode pad 44A, lower electrode pad 44B are L44, the short-side width of the upper electrode pad 44A, lower electrode pad 44B are W44.

The side disposed part 22b is a part disposed on side surfaces of the laminated structure part 21, the lower piezoelectric-material protective-film 14 and upper piezoelectric-material protective-film 24. The side disposed part 22b has an upper side part 22a1, a middle side part 22a2 and a lower side part 22a, as illustrated in FIG. 9. The upper side part 22a1 is a part along with the side surface of the upper film part 40A.

The middle side part 22a2 is a part along with the side surface of the middle film part 40B, the lower side part 22a3 is a part along with the side surface of the lower film part 40C.

Further, the surface layer insulating film 22 has a shift-arrangement structure. The shift-arrangement structure means a structure which the upper side part 22a1, the middle side part 22a2 and the lower side part 22a3 are arranged in the positions where they shift to the outside in order. Further, the surface layer insulating film 22 has step part 22S1, step part 22S2.

The step parts 22S1, 22S2 are formed based on the size differences, of surface layer insulating film 22, of the upper film part 40A, middle film part 40B, the lower film part 40C. The step parts 22S1, 22S2 project respectively from the upper side part 22a1, the middle side part 22a2 along with the surface of the piezoelectric-material film 13 and connect with the middle side part 22a2, lower side part 22a3. Namely, the part between the upper side part 22a1 and the middle side part 22a2 is the step part 22S1, the part between the middle side part 22a2 and the lower side part 22a3 is the step part 22S2.

The, as illustrated in FIG. 4, the thin-film piezoelectric-material element 12b, having the above-described structure, is connected to suspension pads 26, 26 with connecting electrodes 18b (referred to also connecting pad, can be formed with solder, for example). In this case, connecting electrodes 18b, 18b connect respective outer end surfaces of the upper, lower electrode pads 44A, 44B to suspension pads 26, 26.

Note that connecting wiring 81 and thin-film piezoelectric-material elements 12b, 12a are shown in FIG. 2 to FIG. 4, for illustration of convenience, they are not exposed in the surface of the flexure 6, because they are covered with not-illustrated protective insulating layer.

(Method of Manufacturing the Thin-Film Piezoelectric-Material Element)

Figure 11:
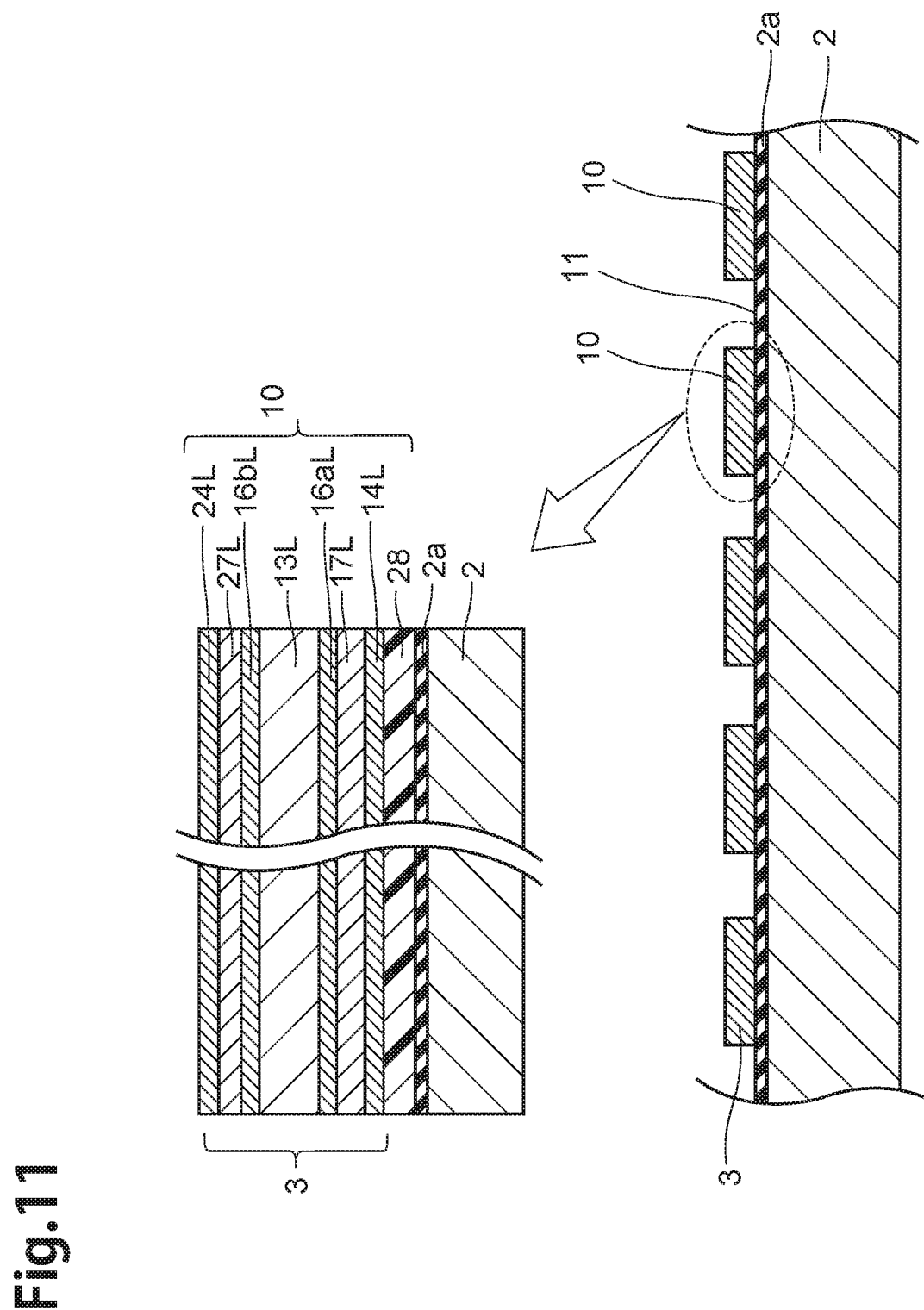
FIG. 11 is a sectional view taken along the line 11-11 in FIG. 10 (*b*)
Figure 12:
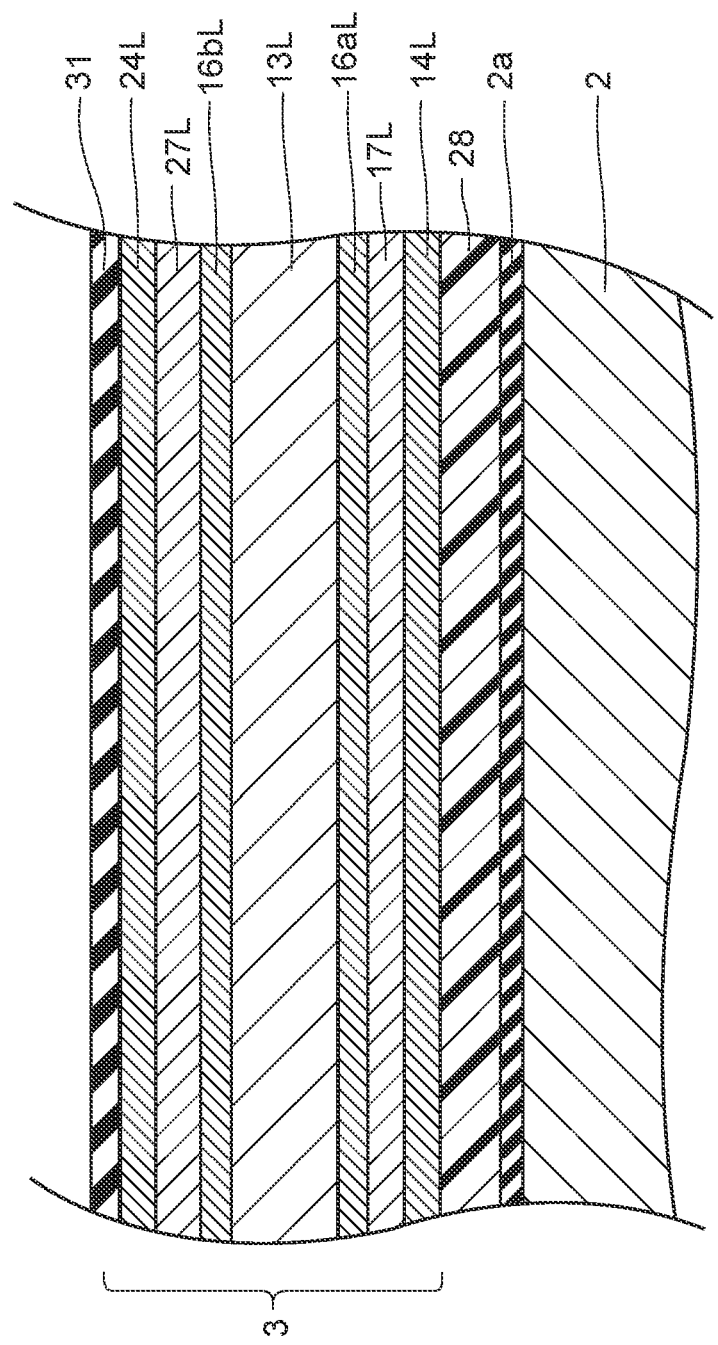
FIG. 12 is a sectional view, partially omitted, showing a thin-films laminated part forming step and a laminated structure part forming step.
Figure 13:
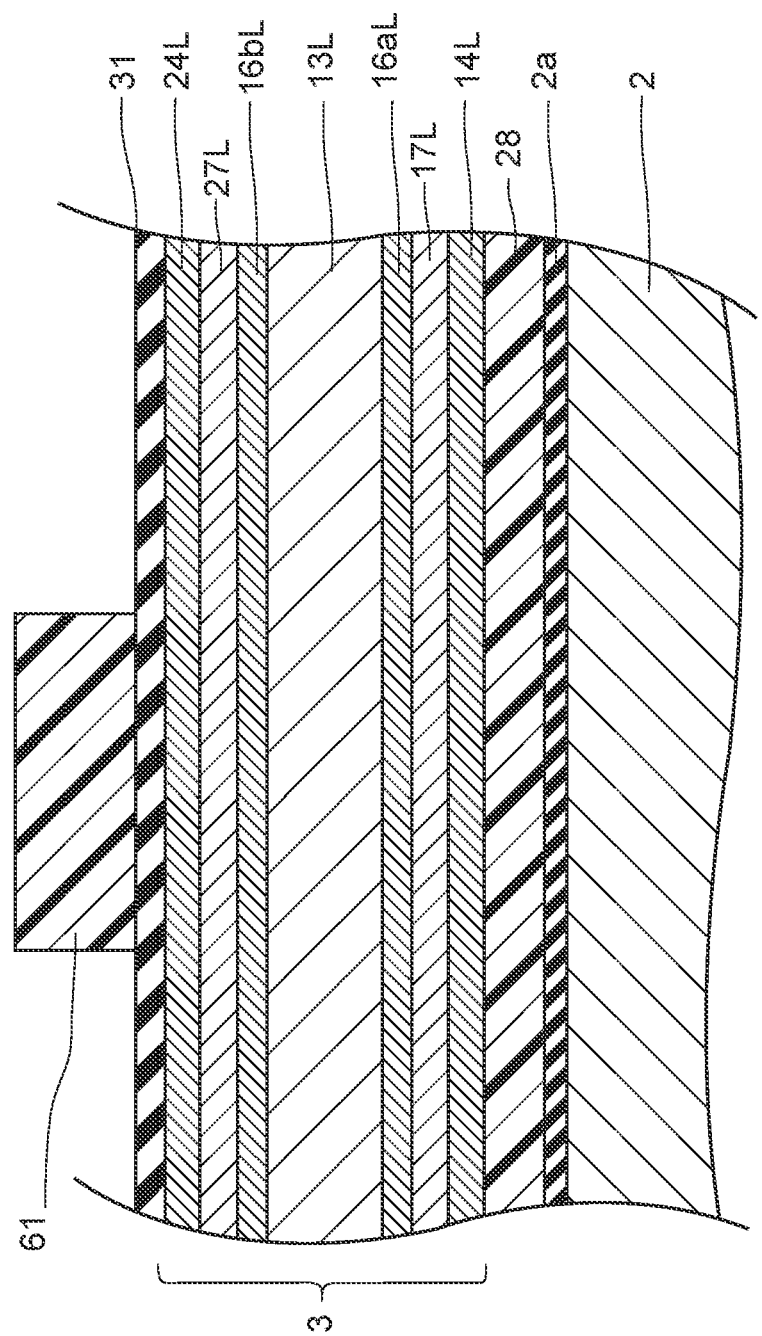
FIG. 13 is a sectional view, partially omitted, showing a manufacturing step of the laminated structure part forming step subsequent to that in FIG. 12.
Figure 16:
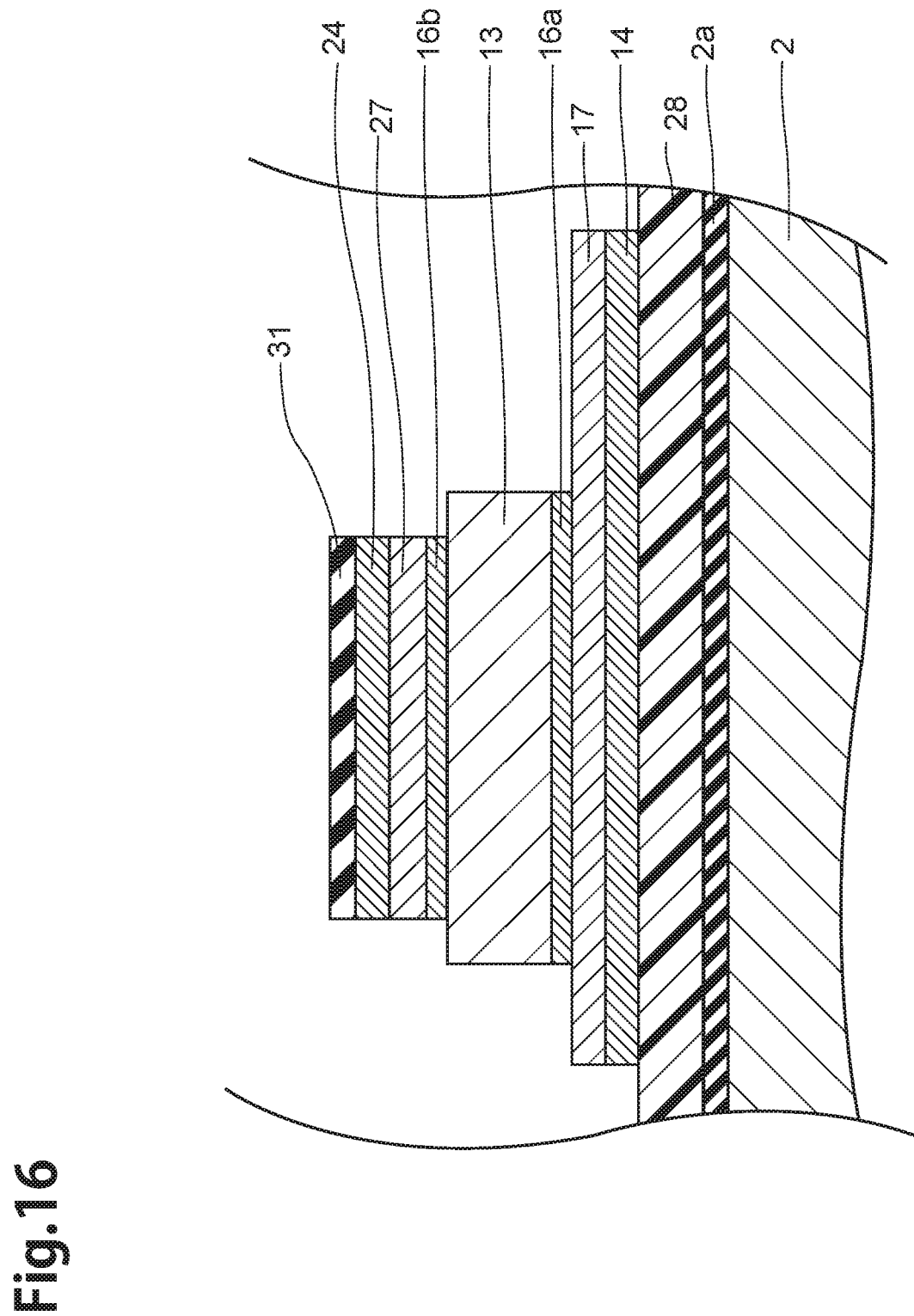
FIG. 16 is a sectional view, partially omitted, showing manufacturing step subsequent to that in FIG. 15.
Figure 17:
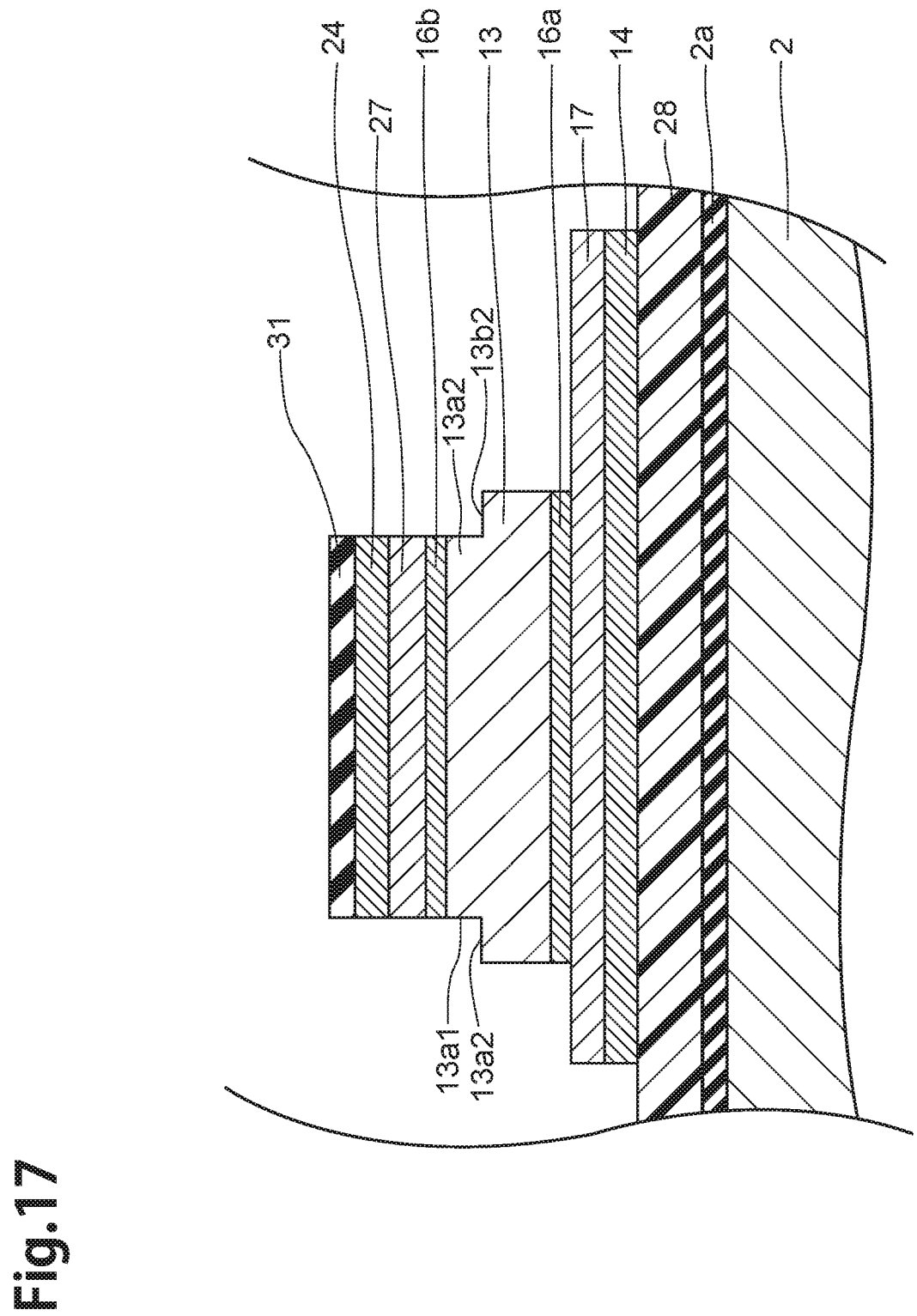
FIG. 17 is a sectional view, partially omitted, showing manufacturing step subsequent to that in FIG. 16.
Figure 18:
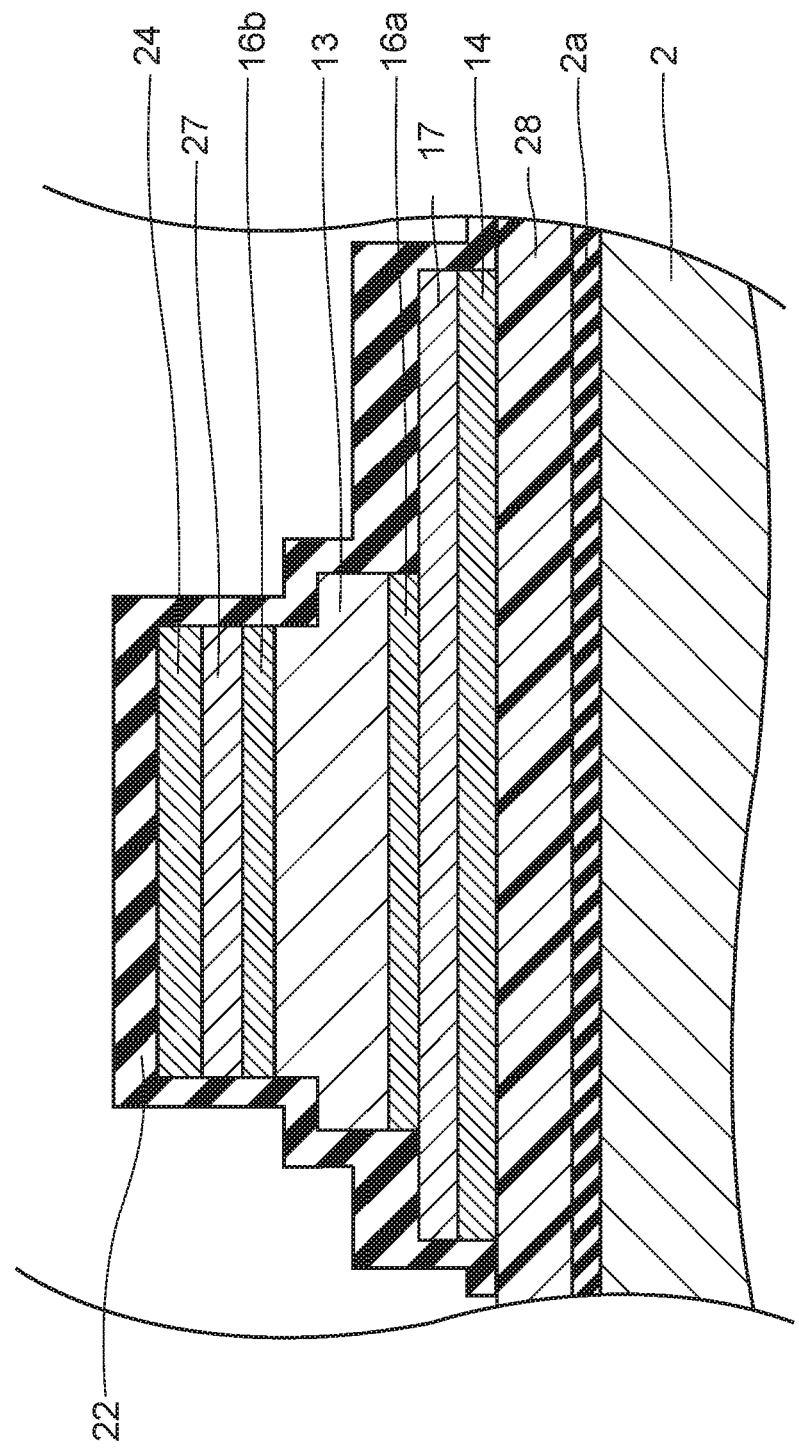
FIG. 18 is a sectional view, partially omitted, showing a surface layer insulating film forming step.
Figure 19:
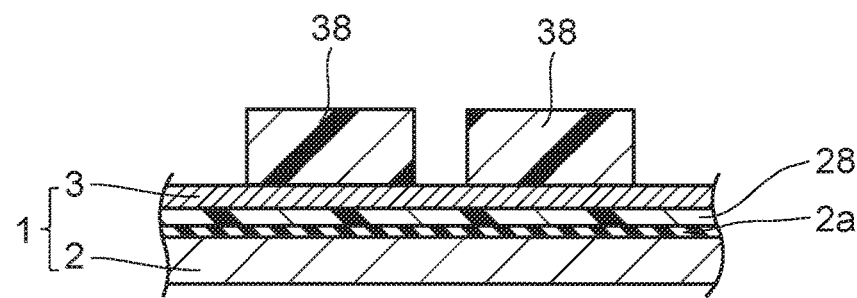
FIG. 19 (*a*) is a sectional view, partially omitted, showing an element region forming step, FIG. 19 (*b*) is a sectional view, partially omitted, showing a manufacturing step subsequent to that in FIG. 19 (*a*)
Figure 19:
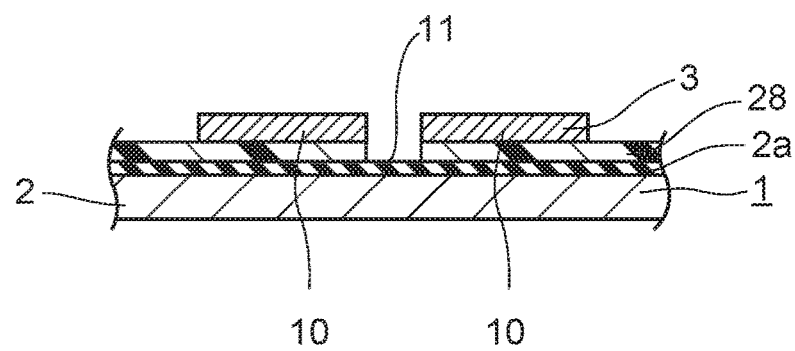

Subsequently, the method of manufacturing the thin-film piezoelectric-material element 12b will be explained with reference to FIG. 10-FIG. 19. Here, FIG. 10 (a) is a perspective view showing whole of the thin-film piezoelectric-material substrate 1, which are used for manufacturing the thin-film piezoelectric-material element 12b according to the embodiment of the present invention, FIG. 10 (b) is a plan view showing the surface of the thin-film piezoelectric-material substrate 1 after forming of element regions with enlargement. FIG. 11 is a sectional view taken along the line 11-11 in FIG. 10 (b). FIG. 12 is a sectional view, partially omitted, showing a thin-films laminated part forming step and a laminated structure part forming step. FIG. 13 is a sectional view, partially omitted, showing a manufacturing step of the laminated structure part forming step subsequent to that in FIG. 12. FIG. 14-FIG. 17 are sectional views, partially omitted, showing manufacturing step respectively subsequent to that in FIG. 13-FIG. 16. FIG. 18 is a sectional view, partially omitted, showing a surface layer insulating film forming step. FIG. 19 (a) is a sectional view, partially omitted, showing an element region forming step, FIG. 19 (b) is a sectional view, partially omitted, showing a manufacturing step subsequent to that in FIG. 19 (a).

The thin-film piezoelectric-material element 12b is manufactured with the thin-films piezoelectric-material substrate 1. The thin-films piezoelectric-material substrate 1 is a substrate for manufacturing the thin-film piezoelectric-material element 12b, and it is manufactured by performing a substrate manufacturing step. A thin-films laminated part forming step, according to the embodiment, is included in the substrate manufacturing step.

In the substrate manufacturing step, at first, a silicon wafer is prepared. Thermal oxidation is performed for the silicon wafer, thereby the insulating layer 2a is formed on one side of the silicon wafer. Then, an insulated Si substrate 2 is obtained. A surface of the silicon wafer, of the side which the insulating layer 2a is formed, is a first surface 1a, and the rear surface is a second surface 1b.

The insulated Si substrate 2 has, as illustrated in FIG. 11, the silicon wafer, as substrate for deposition, and the insulating layer 2a made of $SiO_2$, formed on the surface.

Figure 10:
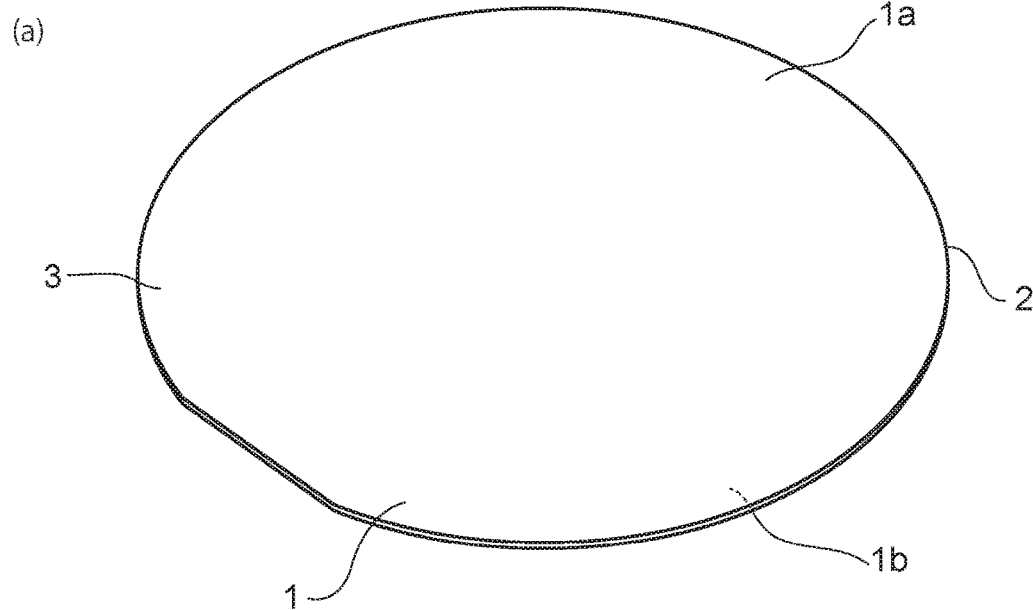
FIG. 10 (*a*) is a perspective view showing whole of the thin-film piezoelectric-material substrate, which are used for manufacturing the thin-film piezoelectric-material element according to the embodiment of the present invention, FIG. 10 (*b*) is a plan view showing the surface of the thin-film piezoelectric-material substrate after forming of element regions with enlargement.
Figure 10:
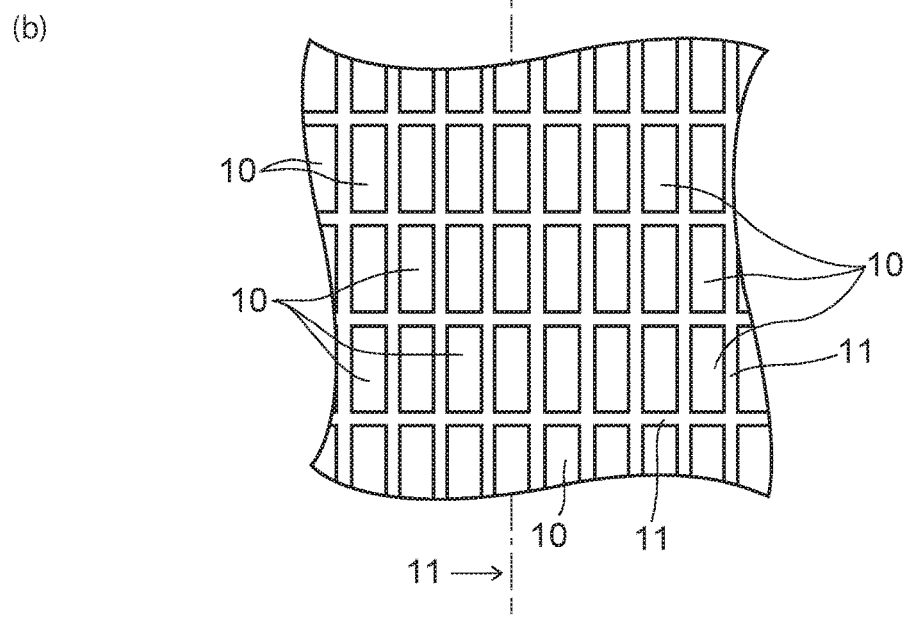

Then, a thin-films laminated part 3 is formed on the first surface 1a of the insulated Si substrate 2, by performing a thin-films laminated part forming step, as illustrated in FIG. 10 (a). Thereby, the thin-films piezoelectric-material substrate 1 is manufactured. The thin-films laminated part 3 is formed on the insulating layer 2a.

The thin-films laminated part forming step has a later-described a lower piezoelectric-material protective-layer forming step, a lower electrode layer forming step, a lower diffusion-barrier-layer forming step, a piezoelectric-material layer forming step, an upper diffusion-barrier-layer forming step, an upper electrode layer forming step and an upper piezoelectric-material protective-layer forming step.

In the lower piezoelectric-material protective-layer forming step, as illustrated in FIG. 12, a lower piezoelectric-material protective-layer 14L is formed. The lower piezoelectric-material protective-layer 14L is formed with alloy material (for example, alloy material including Fe, Co and Mo) having iron (Fe) as main ingredient, by IBD (Ion Beam Deposition). In this case, resin for adhesive is applied on the insulating layer 2a of the insulated Si substrate 2, and the lower piezoelectric-material protective-layer 14L is formed with the resin for adhesive. The adhesive resin layer 28 is formed with the resin for adhesive.

Next, the lower electrode layer forming step is performed. In the lower electrode layer forming step, epitaxial growth, of metal element which has Pt as a main ingredient, is performed on the lower piezoelectric-material protective-layer 14L by sputtering. This epitaxial growth makes the lower electrode layer 17L.

Next, the lower diffusion-barrier-layer forming step is performed. In this step, the lower diffusion-barrier-layer 16aL is formed with SRO for example, on upper surface of the lower electrode layer 17L by sputtering.

Subsequently, the piezoelectric-material layer forming step is performed. In this step, as illustrated in FIG. 12, epitaxial growth of thin-film made of PZT is performed on the lower diffusion-barrier-layer 16aL by sputtering to form the piezoelectric-material layer 13L.

More subsequently, an upper diffusion-barrier-layer forming step is performed. In this step, the upper diffusion-barrier-layer 16bL is formed with SRO for example, on the piezoelectric-material layer 13L by sputtering, as illustrated in FIG. 12.

Further, the upper electrode layer forming step is performed. In this step, growth of metal material having Pt as main ingredient is performed on the upper diffusion-barrier-layer 16bL by sputtering to form the upper electrode layer 27L. The upper electrode layer 27L is able to be no-oriented polycrystal film or a preferentially oriented film with the (110) plane, or (111) plane, not epitaxial growth film.

As described above, the lower diffusion-barrier-layer forming step and the upper diffusion-barrier-layer forming step are performed in the thin-films laminated part forming step. Therefore, the piezoelectric-material layer 13L is formed on the lower electrode layer 17L via the lower diffusion-barrier-layer 16aL, the upper electrode layer 27L is formed on the piezoelectric-material layer 13L via the upper diffusion-barrier-layer 16bL.

After that, the upper piezoelectric-material protective-layer forming step is performed. In the upper piezoelectric-material protective-layer forming step, the upper piezoelectric-material protective-layer 24L is formed, on the upper electrode layer 27L, with alloy material common with the lower piezoelectric-material protective-layer forming step, by IBD (Ion Beam Deposition).

When the thin-films laminated part 3 is formed on the top-surface of the insulating layer 2a, by performing the thin-films laminated part forming step as described above, the thin-films piezoelectric-material substrate 1 is manufactured. Each layer from the lower piezoelectric-material protective-layer 14L to the upper piezoelectric-material protective-layer 24L are included in the thin-films laminated part 3, as illustrated in FIG. 12.

Then the laminated structure part forming step is performed subsequently to the thin-films laminated part forming step. In the laminated structure part forming step, the thin-films laminated part 3 is removed partially, thereby the above-described laminated structure part 21 is formed.

The laminated structure part forming step is performed for each element region 10, as illustrated in FIG. 10(a), FIG. 11. Element regions 10 are formed by dividing the thin-films laminated part 3 regularly in longitudinal direction and horizontal direction. The thin-film piezoelectric-material element 12b is formed from each element region 10. The element regions 10 are separated by gap parts 11, and they are formed by performing later-described element region forming step.

Figure 20:
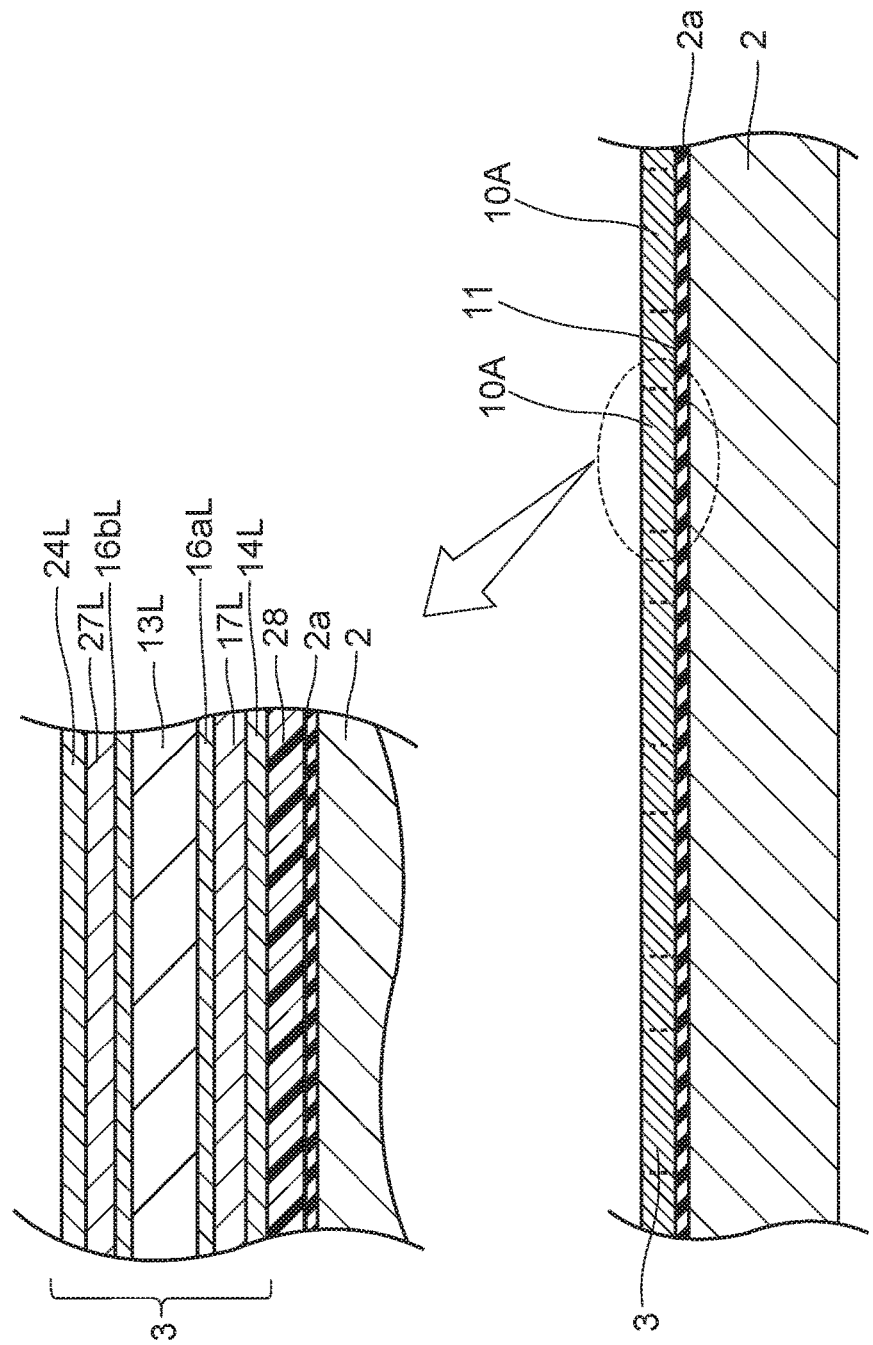
FIG. 20 is a sectional view showing the state before forming the element region, corresponding to FIG. 11.

The laminated structure part forming step is able to be performed for planned-element regions 10A, as illustrated in FIG. 20, which forming the plural element regions 10 are planned, instead of the element regions 10 illustrated in FIG. 11. Note that the case, which the laminated structure part forming step is performed for the planned-element regions 10A before being divided, is illustrated in FIG. 12 to FIG. 18.

A piezoelectric-material protective-film forming step, which the lower piezoelectric-material protective-film 14 and the upper piezoelectric-material protective-film 24 are formed, is included in the laminated structure part forming step. Accordingly, when the laminated structure part forming step is performed, the lower piezoelectric-material protective-film 14 and the upper piezoelectric-material protective-film 24 are formed together with the laminated structure part 21.

Further, the laminated structure part forming step has an upper electrode film forming step and an edge processing step. In the upper electrode film forming step, the upper electrode film 27 is formed. In the edge processing step, the above-described riser end-surfaces 13a1, 13a2, 13a3, 13a4 and the step-surface 13b1, 13b2, 13b3, 13b4 of the piezoelectric-material film 13 are formed. The upper electrode film forming step and the edge processing step are later-explained in detail.

In the laminated structure part forming step, at first, a cap layer 31, made of alumina (Al$_2$O$_3$), is formed on the upper piezoelectric-material protective-layer 24L, as illustrated in FIG. 12. Subsequently, as illustrated in FIG. 13, a resist pattern 61 with not-illustrated photoresist is formed on the cap layer 31. An ion milling or RIE (Reactive Ion Etching) is performed with the resist pattern 61 as a mask to remove the unnecessary parts of the cap layer 31, the upper piezoelectric-material protective-layer 24L, the upper electrode layer 27L and the upper diffusion-barrier-layer 16bL.

Figure 14:
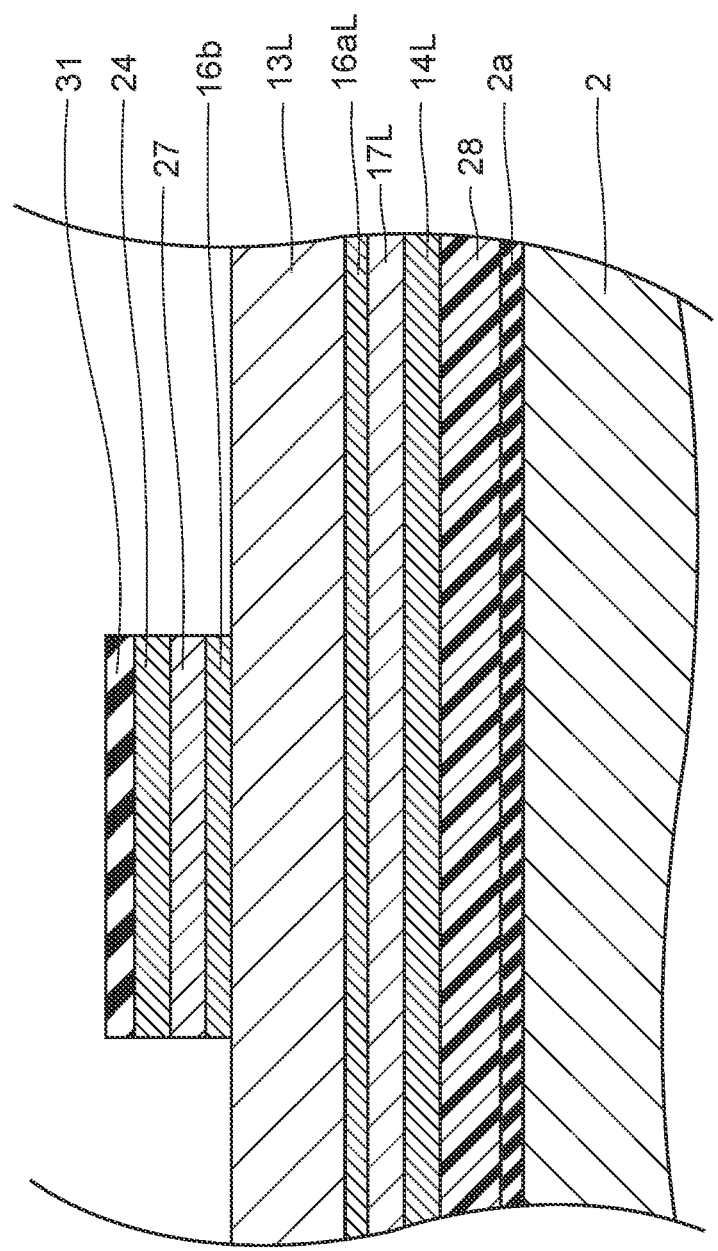
FIG. 14 is a sectional view, partially omitted, showing manufacturing step subsequent to that in FIG. 13.

Then, as illustrated in FIG. 14, the upper piezoelectric-material protective-film 24, the upper electrode film 27 and the upper diffusion-barrier-film 16b are respectively formed from the upper piezoelectric-material protective-layer 24L, the upper electrode layer 27L and the upper diffusion-barrier-layer 16bL. In this case, the upper piezoelectric-material protective-film 24, the upper electrode film 27 and the upper diffusion-barrier-film 16b are formed by the size of the above-described upper film part 40A.

The ion milling or the like is performed with the resist pattern 61 as a mask to form the upper electrode film 27 together with the upper piezoelectric-material protective-film 24 and the upper diffusion-barrier-film 16b. In this case, because the upper electrode film 27 or the like are formed in the size of the upper film part 40A, the upper electrode film 27 or the like are formed in the size smaller than the piezoelectric-material film 13 on the piezoelectric-material film 13. Therefore, the ion milling or the like with the resist pattern 61 is corresponding to the upper electrode forming step.

Figure 15:
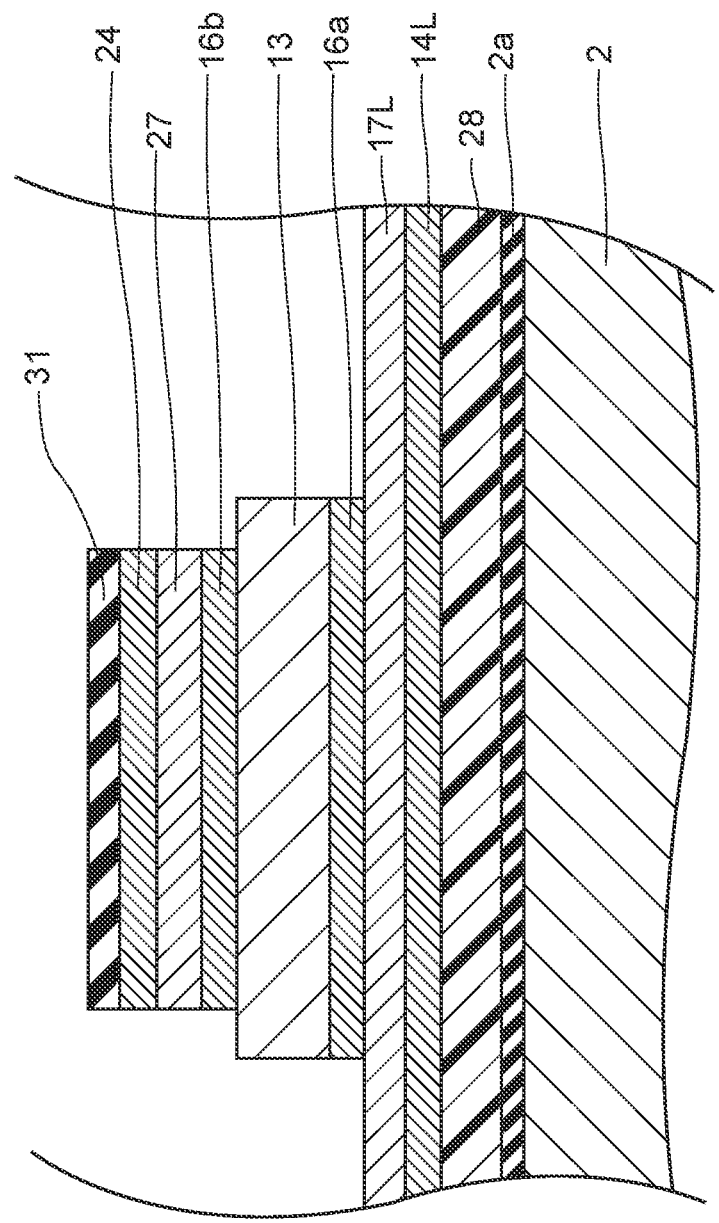
FIG. 15 is a sectional view, partially omitted, showing manufacturing step subsequent to that in FIG. 14.

Subsequently, not-illustrated resist pattern is used as a mask, a pattering, for the piezoelectric-material layer 13L and the lower diffusion-barrier-layer 16aL, is performed to remove unnecessary parts of the piezoelectric-material layer 13L and the lower diffusion-barrier-layer 16aL. Then the piezoelectric-material film 13 and the lower diffusion-barrier-film 16a are formed from the piezoelectric-material layer 13L and the lower diffusion-barrier-layer 16aL, as illustrated in FIG. 15. In this case, the piezoelectric-material film 13 and the lower diffusion-barrier-film 16a are formed by the size of the above-described middle film part 40B.

Next, the edge processing step is performed. In this step, as illustrated in FIG. 17, ion milling is performed with the cap layer 31 as a mask. Then, about the upper surface 13t, of the upper electrode film 27 side of the piezoelectric-material film 13, the parts situated outside of the upper electrode film 27 are removed. Thereby, the above-described riser end-surfaces 13a1, 13a2, 13a3, 13a4 and the step-surface 13b1, 13b2, 13b3, 13b4 are formed (the riser end-surfaces 13a3, 13a4 and the step-surface 13b3, 13b4 are omitted, FIG. 17).

More subsequently, not-illustrated resist pattern is used as a mask, a pattering, for the lower electrode layer 17L and the lower piezoelectric-material protective-layer 14L, is performed to remove unnecessary parts of the lower electrode layer 17L and the lower piezoelectric-material protective-layer 14L. Then the lower electrode film 17 and the lower piezoelectric-material protective-film 14 are formed from the lower electrode layer 17L and the lower piezoelectric-material protective-layer 14L. In this case, the lower electrode film 17 and the lower piezoelectric-material protective-film 14 are formed by the size of the above-described lower film part 40C.

The above-described steps are performed to form the laminated structure part 21. Further, the lower piezoelectric-material protective-film 14 and the upper piezoelectric-material protective-film 24 are formed to sandwich the laminated structure part 21.

Then, the upper piezoelectric-material protective-film 24 and the upper electrode film 27 of the laminated structure part 21, the piezoelectric-material film 13 of the laminated structure part 21, the lower electrode film 17 of the laminated structure part 21 and the lower piezoelectric-material protective-film 14 are respectively formed with the size of the upper film part 40A, the middle film part 40B, the lower film part 40C. Therefore, the formed upper piezoelectric-material protective-film 24, the laminated structure part 21 and lower piezoelectric-material protective-film 14 have the above-described film-size extended structure. Further, in each film, both long-side width and short-side width are extended in order of the upper film part 40A, the middle film part 40B, the lower film part 40C.

After performing the laminated structure part forming step, RIE (Reactive Ion Etching), with oxygen gas, is performed, to remove the unnecessary part of the adhesive resin layer 28. In this case, as illustrated in FIG. 16, RIE is performed in a state which the cap layer 31 remains on the upper piezoelectric-material protective-film 24. By this, the upper piezoelectric-material protective-film 24 is protected so as not to be oxidized. After that, ion-milling or RIE is performed to remove the cap layer 31.

Next, a surface layer insulating film forming step is performed. In the surface layer insulating film forming step, as illustrated in FIG. 18, the surface layer insulating film 22 is formed with polyimide. The surface layer insulating film 22 is arranged on the side surfaces of the laminated structure part 21, the lower piezoelectric-material protective-film 14 and the upper piezoelectric-material protective-film 24, and the top-surface of the upper piezoelectric-material protective-film 24, in each element region 10 or each planned-element region 10A.

In this case, the laminated structure part 21, the lower piezoelectric-material protective-film 14 and the upper piezoelectric-material protective-film 24 have the film-size extended structure. Therefore, the surface layer insulating film 22 is formed so as to have the above-described shift-arrangement structure and step parts 22S1, 22S2.

On the other hand, the element region forming step is performed as following. In the element region forming step, at first, not-illustrated photoresist is applied on the surface of the thin-films piezoelectric-material substrate 1 to form a photoresist layer on the thin-films laminated part 3, as illustrated in FIG. 19 (a). Subsequently, a patterning, with not-illustrated photo mask, is performed to form a resist pattern 38.

After that, ion-milling, RIE or etching is performed for the thin-films laminated part 3 with the resist pattern 38 as a mask to remove unnecessary parts of the thin-films laminated part 3 and adhesive resin layer 28. Then, as illustrated in FIG. 19 (b), the thin-films laminated part 3 and adhesive resin layer 28 are divided into the plural element region 10 via gap parts 11.

An electrode pad forming step is performed after the element region forming step. In the electrode pad forming step, unnecessary parts of the surface layer insulating film 22 and upper piezoelectric-material protective-film 24 are removed by etching to form the upper through hole 23A, lower through hole 23B. After that, plating or the like is performed to form the upper electrode pad 44A, lower electrode pad 44A in the upper through hole 23A, lower through hole 23B, in each element region 10.

In case of HDD, the insulated Si substrate 2 is removed from the thin-films piezoelectric-material substrate 1, by etching or the like. Thereby the plural thin-film piezoelectric-material elements 12b are formed. For example, the formed thin-film piezoelectric-material elements 12b are adhered to the surface of the base insulating layer 5 of the HGA 91.

(Operation and Effect of Thin-Film Piezoelectric-Material Element)

In the above-described thin-film piezoelectric-material element 12b, the piezoelectric-material film 13 has the film-size larger than the upper electrode film 27.

Figure 25:
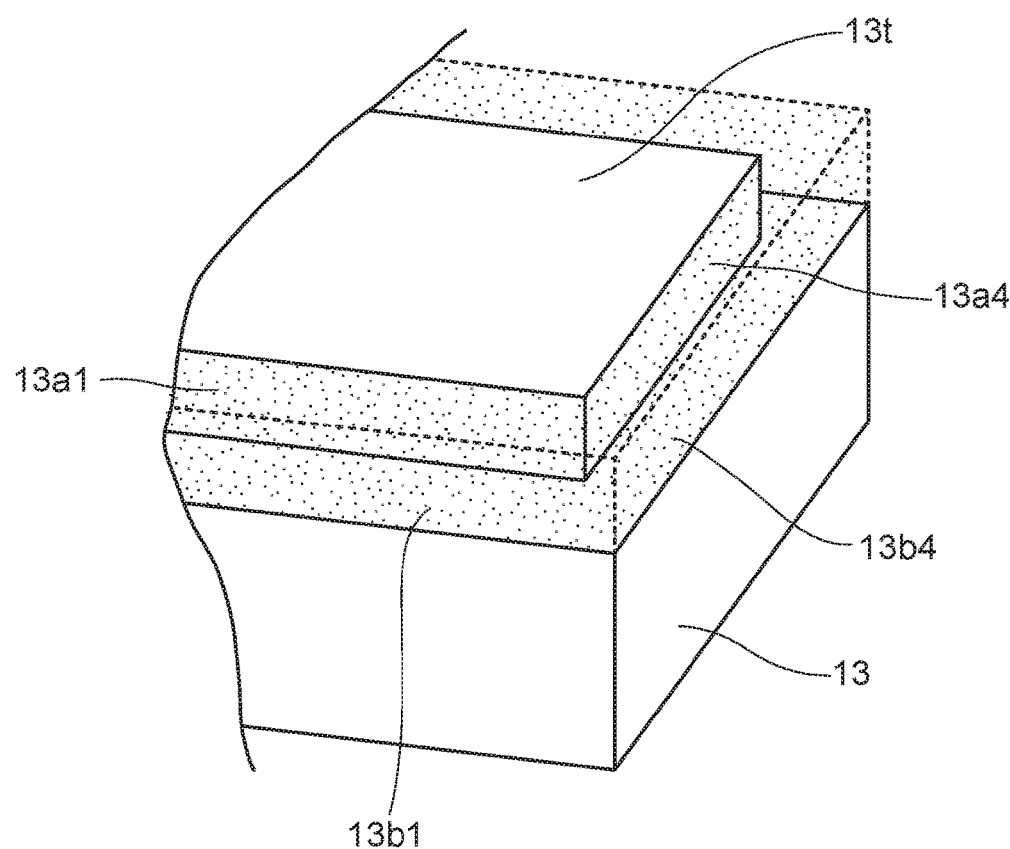
FIG. 25 is a perspective view showing the piezoelectric-material film, partially omitted, according to the embodiment of the present invention.

However, as illustrated in FIG. 25, the piezoelectric-material film 13 has the riser end-surfaces 13a1, 13a2, 13a3, 13a4 and step-surfaces 13b1, 13b2, 13b3, 13b4 formed on the top-surface 13t (the riser end-surfaces 13a2, 13a3 and step-surfaces 13b3, 13b3 are omitted in FIG. 25). The piezoelectric-material film 13 has a structure which outside-parts of the top-surface 13t side, situated outside than the upper electrode film 27, do not exist. Namely, in FIG. 25, in the piezoelectric-material film 13, the peripheral parts with dot of the top-surface 13t do not exist in the both-sides of the long-side direction and both-sides of the short-side direction.

In the top-surface 13t, because the upper electrode film 27 does not directly contact with the outside-parts, situated outside than the upper electrode film 27, voltage is hardly applied to the outside-parts. If the outside-parts, situated outside than the upper electrode film 27, exist in the piezoelectric-material film, charge remain easily in the outside-parts. Accordingly, such piezoelectric-material film easily charges static electricity.

However, in the thin-film piezoelectric-material element 12b, the piezoelectric-material film 13 has the structure which the outside-parts, situated outside than the upper electrode film 27, do not exist in the top-surface 13t. Therefore, the piezoelectric-material film 13 hardly charges static electricity. Accordingly, electric failure never occurs around the thin-film piezoelectric-material element 12b.

Further, in the piezoelectric-material film 13, because the outside-parts, situated outside than the upper electrode film 27, do not exist in the both-sides of the long-side direction, and the both-sides of the shot-side direction, occurrence of the static electricity is surely prevented.

On the other hand, in the above-described thin-film piezoelectric-material element 12b, the lower piezoelectric-material protective-film 14 and the upper piezoelectric-material protective-film 24 are formed to sandwich the laminated structure part 21. Therefore, the piezoelectric-material film 13, included in the laminated structure part 21, is protected by the lower piezoelectric-material protective-film 14 and the upper piezoelectric-material protective-film 24. Therefore, the piezoelectric-material film 13 hardly takes the both downward pressure and upward pressure.

Because the riser end-surfaces 13a1, 13a2, 13a3, 13a4 and the step-surface 13b1, 13b2, 13b3, 13b4 are formed in the piezoelectric-material film 13, the piezoelectric-material film 13 itself has the structure which hardly takes the influence of the pressure.

By the way, the HGA 91, which the thin-film piezoelectric-material element 12b is mounted, is accommodated in the not-illustrated housing of the later-described HDD 201 together with the other parts. Helium gas is filled up into the housing of the HDD 201 with certain pressure. Therefore, the pressured helium gas reaches the HGA 91, and also reaches the thin-film piezoelectric-material element 12b. Then the downward pressure of the helium gas possibly reaches the piezoelectric-material film 13 via the surface layer insulating film 22. Further, upward pressure possibly reaches the piezoelectric-material film 13 via the flexure substrate 4, the base insulating layer 5. Because, the piezoelectric-material film 13 is formed by a thin-film-shaped, the piezoelectric-material film 13 easily takes both upward pressure and downward pressure. The piezoelectric-material film 13 possibly causes crooked displacement (not intended displacement).

However, in thin-film piezoelectric-material element 12b, the lower piezoelectric-material protective-film 14 and the upper piezoelectric-material protective-film 24 are formed to sandwich the laminated structure part 21. Both the upper surface side and lower surface side of the piezoelectric-material film 13, which pressure reaches easily, are protected by the upper piezoelectric-material protective-film 24 and the lower piezoelectric-material protective-film 14. Therefore, pressure of helium gas hardly reaches the piezoelectric-material film 13. Accordingly, in thin-film piezoelectric-material element 12b, the possibility, which the piezoelectric-material film 13 cause crooked displacement, is lowered than the case which the lower piezoelectric-material protective-film 14 and the upper piezoelectric-material protective-film 24 are not formed.

Accordingly, in thin-film piezoelectric-material element 12b, the possibility, which characteristic of the piezoelectric-material film 13 deteriorates with the passage of time, is lowered, thereby the performance of the thin-film piezoelectric-material element 12b is able to be maintained as much as possible, even if helium gas is filled up into the housing or enclosure.

Figure 21:
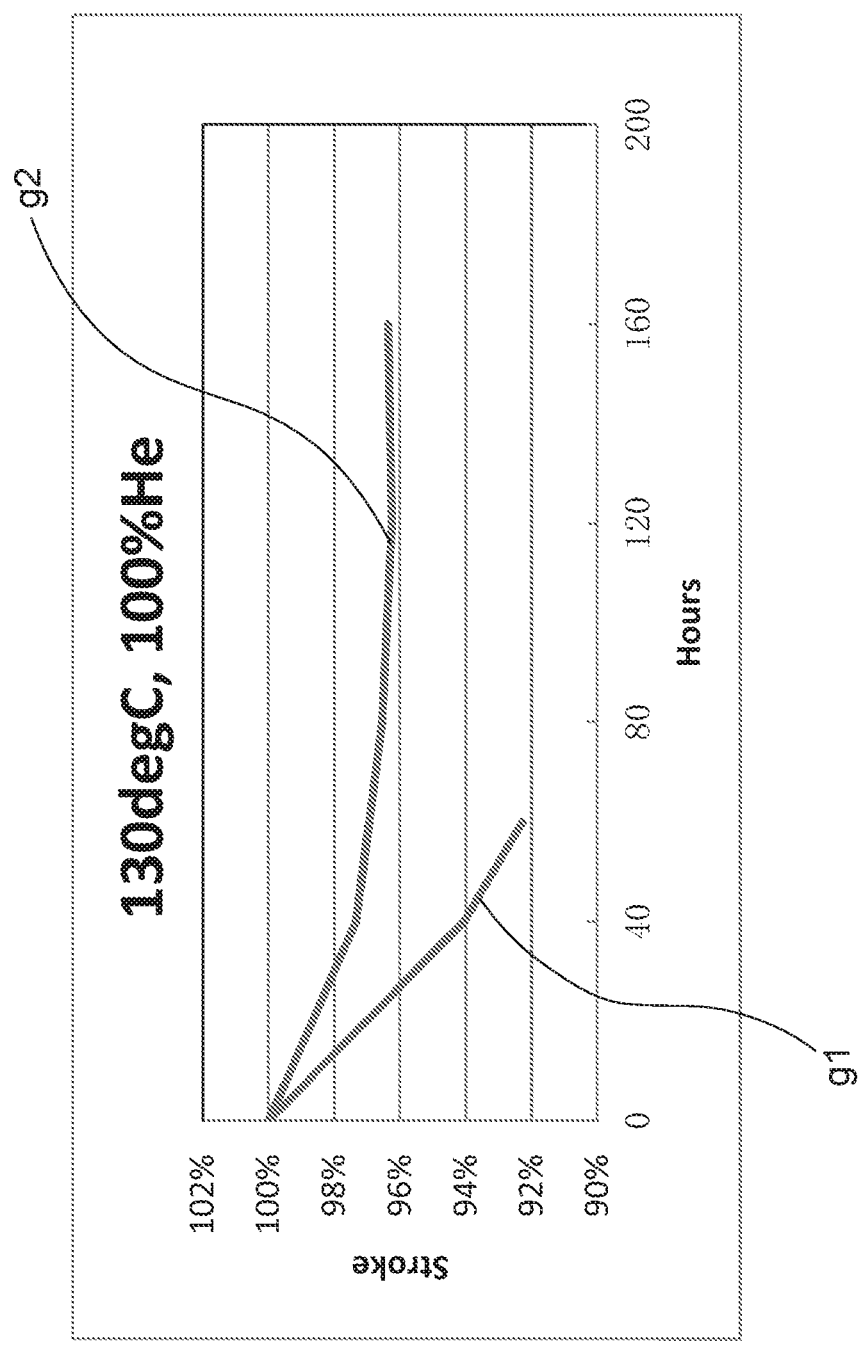
FIG. 21 is a graph showing change of stroke of the thin-film piezoelectric-material element with the passage of time.

Here, FIG. 21 is a graph showing change of stroke of the thin-film piezoelectric-material element with the passage of time. g1 is a graph showing change of stroke of the conventional thin-film piezoelectric-material element, having neither lower piezoelectric-material protective-film 14 and the upper piezoelectric-material protective-film 24. g2 is a graph showing change of stroke of the thin-film piezoelectric-material element 12b, having the lower piezoelectric-material protective-film 14 and the upper piezoelectric-material protective-film 24.

As illustrated in FIG. 21, in the thin-film piezoelectric-material element 12b, change of stroke is smaller than the conventional thin-film piezoelectric-material element, almost constant stroke is maintained with the passage of time. Accordingly, by having the lower piezoelectric-material protective-film 14 and the upper piezoelectric-material protective-film 24, the performance of thin-film piezoelectric-material element 12b is able to be maintained as much as possible.

As described above, the thin-film piezoelectric-material element 12b has a structure which the performance is hardly lowered even if helium gas is filled up into the housing or enclosure.

In the HGA 91, in case of the thin-film piezoelectric-material elements 12b, the flexure substrate 4, the base insulating layer 5, other than the thin-film piezoelectric-material element 12b, are arranged in the lower side of the thin-film piezoelectric-material element 12b though, another member than the thin-film piezoelectric-material element 12b is not arranged in the upper side. Therefore, the piezoelectric-material film 13 receives easily influence of the downward pressure from outside the surface layer insulating film 22 than the upward pressure.

However, because the thin-film piezoelectric-material element 12b has the film-size extended structure, each film sizes are extended in order of the upper piezoelectric-material protective-film 24 to the lower piezoelectric-material protective-film 14. Therefore, the downward pressure, from outside the surface layer insulating film 22, is dispersed easily without concentration. The pressure, reaches the piezoelectric-material film 13, is also dispersed easily without concentration. Therefore, the possibility, which the piezoelectric-material film 13 cause crooked displacement, is surely lowered. Accordingly, the possibility, which characteristic of the piezoelectric-material film 13 deteriorates, is surely lowered. The possibility, which the performance of the thin-film piezoelectric-material element 12b deteriorates, is also surely lowered.

Moreover, both long-side widths and short-side widths, about all of the upper piezoelectric-material protective-film 24, the upper electrode film 27, the piezoelectric-material film 13, the lower piezoelectric-material protective-film 14 and the lower electrode film 17, are extended in order of the upper film part 40A, the middle film part 40B, the lower film part 40C. Therefore, the pressure, which reaches the piezoelectric-material film 13, are dispersed entirely, hardly concentrates.

Further, because the surface layer insulating film 22, covering the thin-film piezoelectric-material element 12b, has the step parts 22S1, 22S2, influence of the downward pressure reaches not only the top disposed part 22a but also the step parts 22S1, 22S2. Therefore, the pressure, which reaches the piezoelectric-material film 13, is dispersed easily without concentration. Furthermore, because the surface layer insulating film 22 has the shift arrangement structure, the downward pressure also reaches the outside than the piezoelectric-material film 13, therefore, the downward pressure, which reaches the piezoelectric-material film 13, is surely lowered.

Because the thin-film piezoelectric-material element 12b has the lower diffusion-barrier-film 16a and the upper diffusion-barrier-film 16b, diffusion barrier strength of the lower electrode film 17, the piezoelectric-material film 13 and the upper electrode film 27 has been elevated.

(Modified Example)

In the above-described thin-film piezoelectric-material element 12b, the piezoelectric-material film 13 has the structure which outside-parts do not exist in the both-sides of the long-side direction and the both-sides of the short-side direction.

Figure 23:
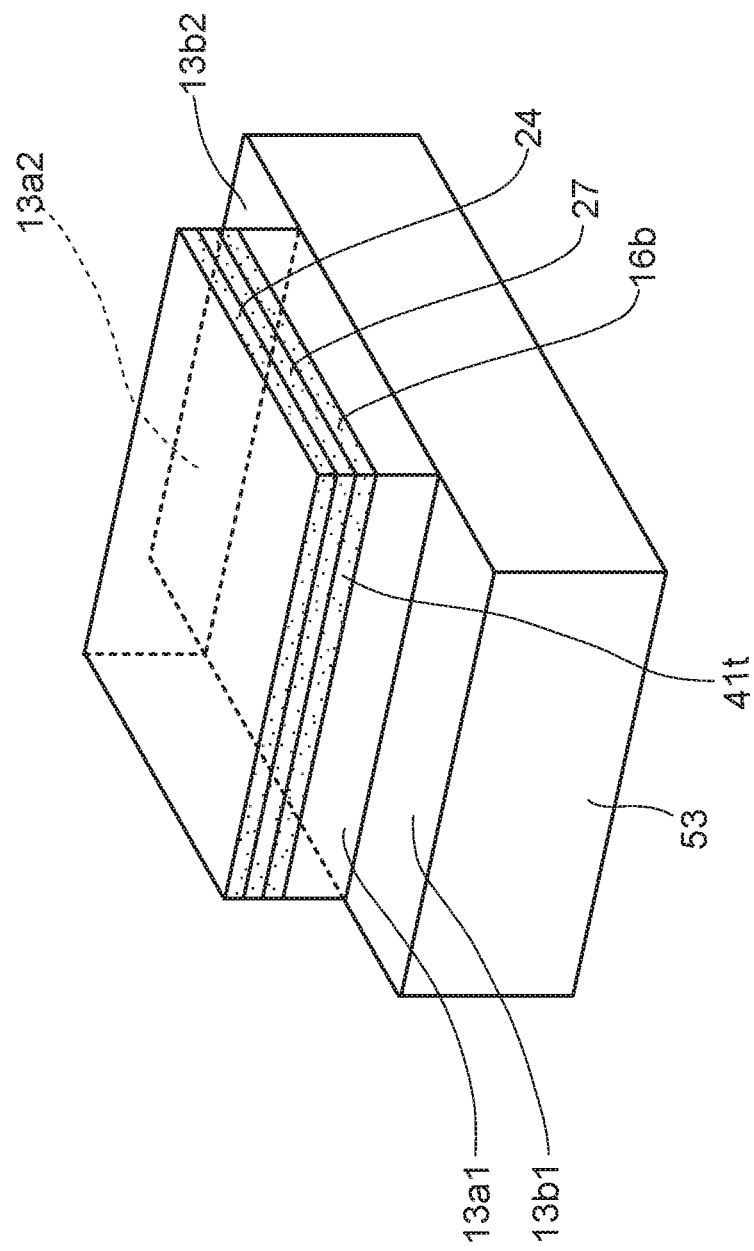
FIG. 23 is a perspective view showing the piezoelectric-material film, the upper diffusion-barrier-film, the upper electrode film, the upper piezoelectric-material protective-film according to a modified example.
Figure 24:
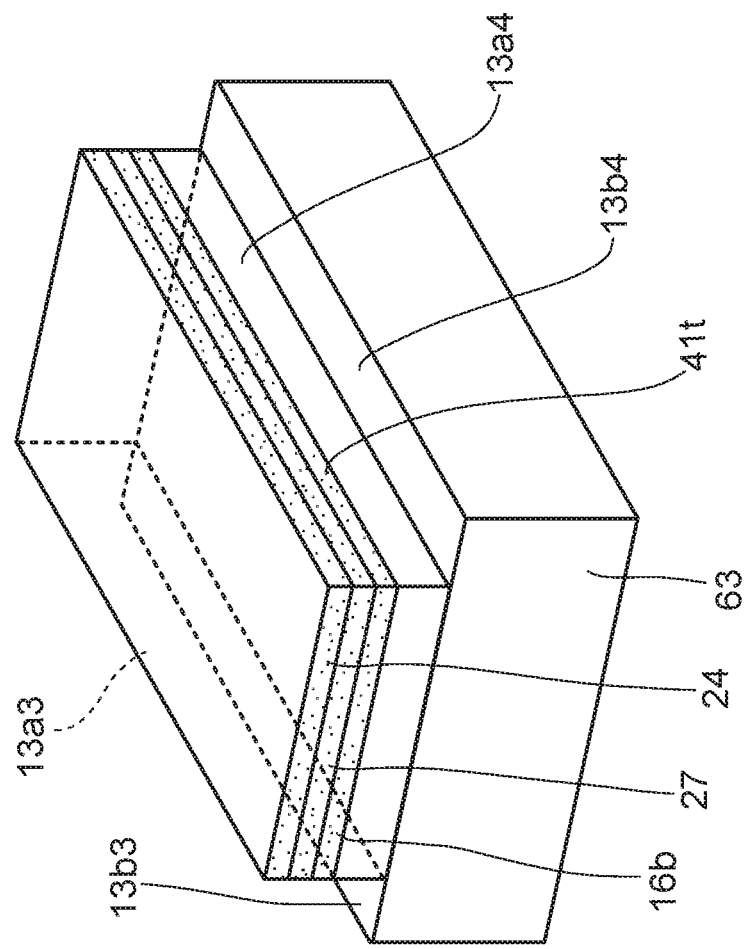
FIG. 24 is a perspective view showing the piezoelectric-material film, the upper diffusion-barrier-film, the upper electrode film, the upper piezoelectric-material protective-film according to another modified example.

The thin-film piezoelectric-material element 12b is able to have the piezoelectric-material film 53, illustrated in FIG. 23 instead of the piezoelectric-material film 13. Further, the thin-film piezoelectric-material element 12b is able to have the piezoelectric-material film 63, illustrated in FIG. 24 instead of the piezoelectric-material film 13. The piezoelectric-material film 53 has the riser end-surfaces 13a1, 13a2 and step-surface 13b1, 13b2, arranged in the both-sides of the long-side direction though, it does not have the riser end-surfaces 13a3, 13a4 and step-surface 13b3, 13b4.

Further, the piezoelectric-material film 63 has the riser end-surfaces 13a3, 13a4 and step-surface 13b3, 13b4, arranged in the both-sides of the short-side direction though, it does not have the riser end-surfaces 13a1, 13a2 and step-surface 13b1, 13b2. Because both the piezoelectric-material film 53 and the piezoelectric-material film 63 have the structure which outside-parts do not partially exist, they hardly charge static electricity. Accordingly, electric failure never occurs around the thin-film piezoelectric-material element 12b.

(Embodiments of Hard Disk Drive)

Next, embodiments of the hard disk drive will now be explained with reference to FIG. 21.

Figure 26:
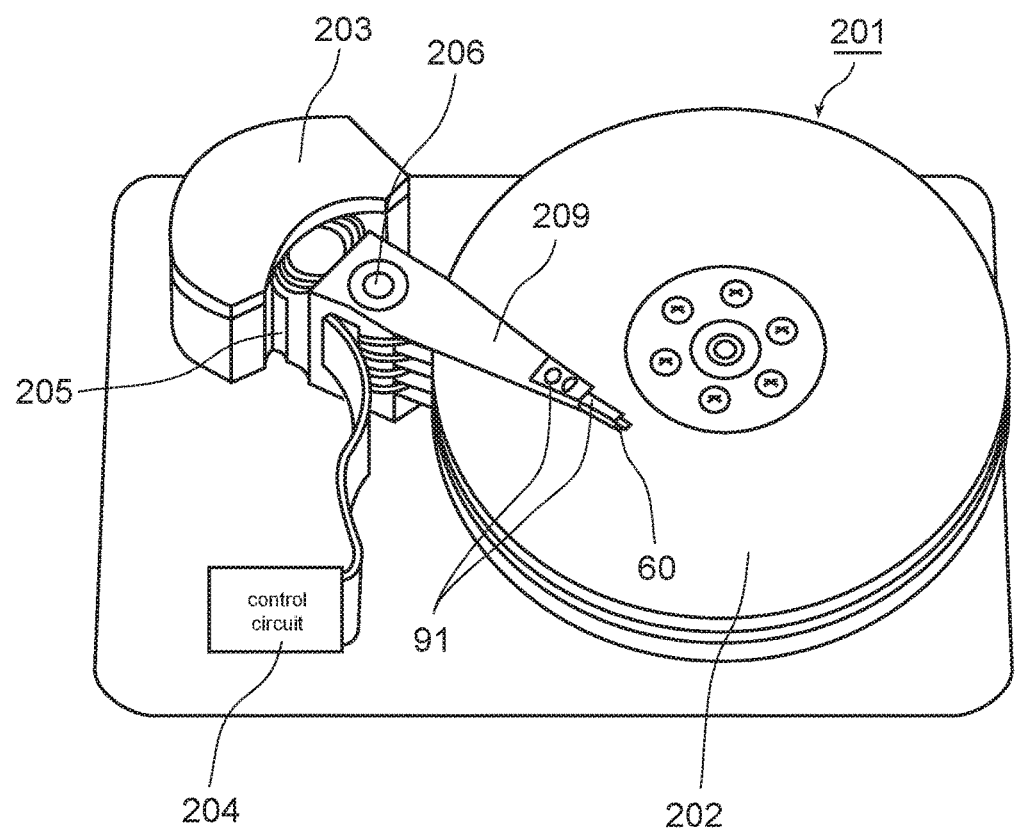
FIG. 26 is a perspective view showing a hard disk drive equipped with the HGA according to the embodiment of the present invention.
Figure 27:
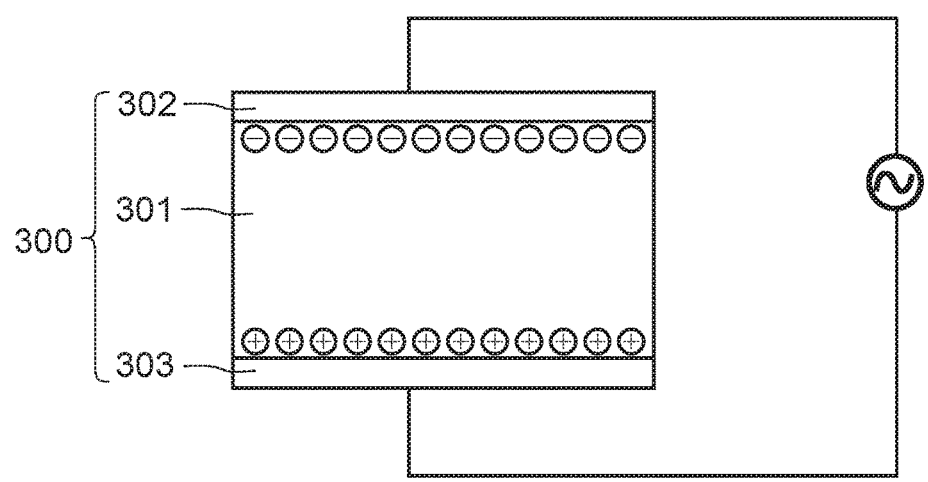
FIG. 27 is a perspective view showing the conventional thin-film piezoelectric-material element having the piezo-electric-material film, the upper electrode film, the lower electrode film, formed equally in their size and a power source.
Figure 28:
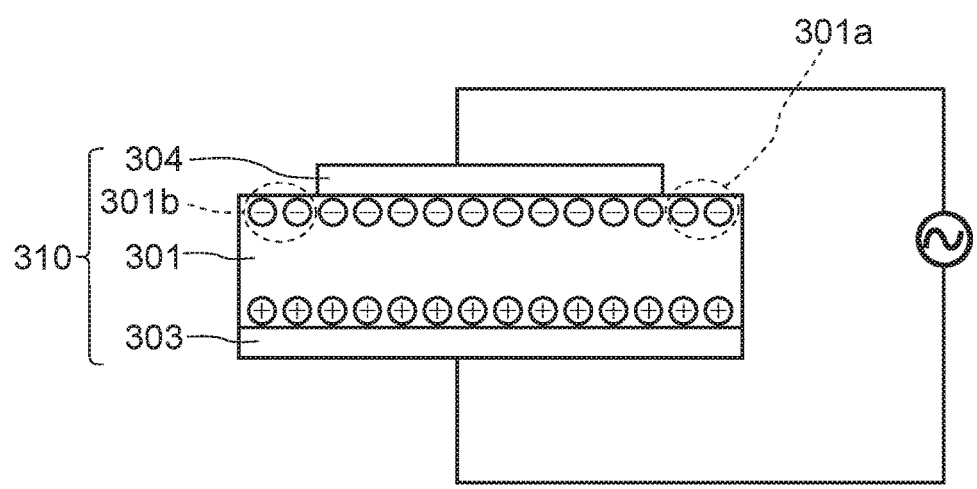
FIG. 28 is a perspective view showing the conventional thin-film piezoelectric-material element having the upper electrode film, smaller than the piezoelectric-material film and the power source.
Figure 29:
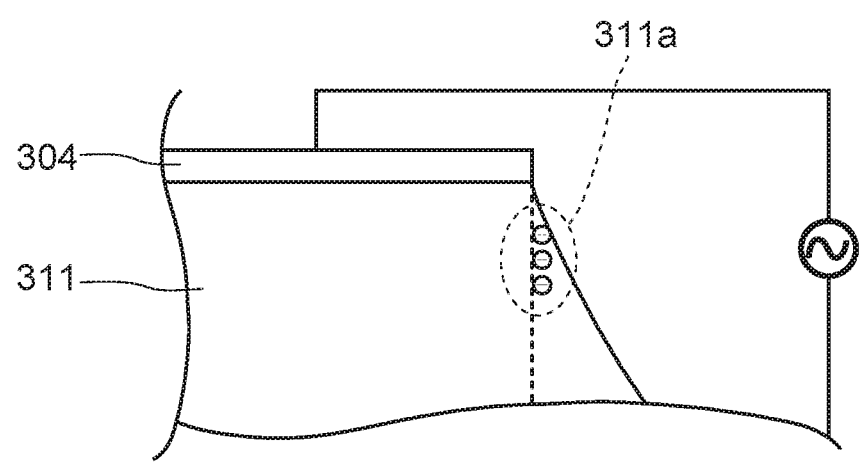
FIG. 29 is a perspective view, partially omitted, showing the conventional thin-film piezoelectric-material element having the piezoelectric-material film, which the side surface is processed into the taper-shaped and the upper electrode film and the power source.

FIG. 26 is a perspective view illustrating a hard disk drive 201 equipped with the above-mentioned HGA 91. The hard disk drive 201 includes a hard disk (magnetic recording medium) 202 rotating at a high speed and the HGA 91. The hard disk drive 201 is an apparatus which actuates the HGA 91, so as to record/reproduce data onto/from recording surfaces of the hard disk 202. The hard disk 202 has a plurality of (4 in the drawing) platters. Each platter has a recording surface opposing its corresponding the head slider 60.

The hard disk drive 201 positions the head slider 60 on a track by an assembly carriage device 203. A thin-film magnetic head, not illustrated, is formed on this head slider 60. Further, the hard disk drive 201 has a plurality of drive arms 209. The drive arms 209 pivot about a pivot bearing shaft 206 by means of a voice coil motor (VCM) 205, and are stacked in a direction along the pivot bearing shaft 206. Further, the HGA 91 is attached to the tip of each drive arm 209.

Further, the hard disk drive 201 has a control circuit 204 controlling recording/reproducing.

In the hard disk drive 201, when the HGA 91 is rotated, the head slider 60 moves in a radial direction of the hard disk 202, i.e., a direction traversing track lines.

In case such hard disk drive 201 are formed with the above-described thin-film piezoelectric-material elements 12a, 12b, because the piezoelectric-material film 13 hardly charges static electricity, electric failure never occurs around the thin-film piezoelectric-material element 12b.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A thin-film piezoelectric-material element comprising:
   a laminated structure part comprising a lower electrode film, a piezoelectric-material film laminated on the lower electrode film and an upper electrode film laminated on the piezoelectric-material film;
   a lower piezoelectric-material protective-film being formed with alloy material;
   an upper piezoelectric-material protective-film being formed with alloy material,
   a surface layer insulating film, which are disposed on the side surfaces of the laminated structure part, the lower piezoelectric-material protective-film and the upper piezoelectric-material protective-film and on the top-surface of the upper piezoelectric-material protective-film, and which a through hole is formed; and
   a lower electrode pad being directly in contact with an exposed surface, of the lower electrode film, exposed inside the through hole,
   wherein the piezoelectric-material film comprising:
   a film-size larger than the upper electrode film; and
   a riser end-surface and a step-surface, formed on a top-surface of the upper electrode film side,
   wherein the riser end-surface connects smoothly with a peripheral end-surface of the upper electrode film and vertically intersects with the top-surface of the piezoelectric-material film,
   wherein the step-surface intersects vertically with the riser end-surface,
   wherein the lower piezoelectric-material protective-film and the upper piezoelectric-material protective-film are formed to sandwich the laminated structure part, respectively in the lower side of the lower electrode film and the upper side of the upper electrode film,
   wherein the lower piezoelectric-material protective-film and the upper piezoelectric-material protective-film are formed with alloy material including Fe as main ingredient and having Co and Mo, by Physical Vapor Deposition.

* * * * *